United States Patent
Ludwig

(10) Patent No.: US 8,941,047 B2
(45) Date of Patent: Jan. 27, 2015

(54) MOLECULAR TRANSISTOR DRIVING OF NANOSCALE ACTUATORS FROM DIFFERENTIAL AMPLIFIER CIRCUITS COMPATIBLE WITH CARBON NANOTUBE SENSORS AND TRANSDUCERS

(75) Inventor: Lester F. Ludwig, Belmont, CA (US)

(73) Assignee: Pike Group LLC, Dover, DE (US)

( * ) Notice: Subject to any disclaimer, the term of this patent is extended or adjusted under 35 U.S.C. 154(b) by 1018 days.

(21) Appl. No.: 12/951,067

(22) Filed: Nov. 22, 2010

(65) Prior Publication Data
US 2011/0062418 A1 Mar. 17, 2011

Related U.S. Application Data

(63) Continuation of application No. 12/025,562, filed on Feb. 4, 2008, now Pat. No. 7,858,918.

(60) Provisional application No. 60/899,667, filed on Feb. 5, 2007.

(51) Int. Cl.
*H03F 3/45* (2006.01)
*H01L 51/05* (2006.01)
*B82Y 10/00* (2011.01)
*H01L 27/28* (2006.01)
*H01L 51/00* (2006.01)

(52) U.S. Cl.
CPC .............. *H01L 51/0545* (2013.01); *B82Y 10/00* (2013.01); *H03F 3/45381* (2013.01); *H01L 27/283* (2013.01); *H01L 51/0048* (2013.01); *Y10S 977/953* (2013.01)
USPC .................. 250/214 A; 330/253; 977/953

(58) Field of Classification Search
USPC ................ 250/214 A, 214 C, 214 R; 977/938
See application file for complete search history.

(56) References Cited

U.S. PATENT DOCUMENTS

| | | |
|---|---|---|
| 6,962,839 B2 | 11/2005 | Wei et al. |
| 6,982,903 B2 | 1/2006 | Bertin et al. |
| 7,025,652 B2 | 4/2006 | Heo et al. |
| 7,145,824 B2 | 12/2006 | Bill et al. |

(Continued)

OTHER PUBLICATIONS

Z. Chen et. al., "An Integrated Logic Circuit Assembled on a Single Carbon Nanotube," Science, Mar. 24, 2006, vol. 311, pp. 1735.

(Continued)

*Primary Examiner* — Tony Ko

(57) ABSTRACT

A carbon nanotube electronic circuit utilizing a differential amplifier is implemented on a single carbon nanotube. Field effect transistors are formed from a first group of electrical conductors in contact with the carbon nanotube and a second group of electrical conductors insulated from, but exerting electric fields on, the carbon nanotube form the gates of the field effect transistors. A signal input circuit has a first input portion and a second input portion. A first field effect transistor electrically responsive to a first incoming signal is formed on the first input portion. A carbon nanotube actuator having electrical terminals and responsive to electrical conditions is an electrical load. A current source, connected to the signal input circuit, is formed on the carbon nanotube from one or more second field effect transistors. The electrical load is connected to the signal input circuit, and the signal input circuit and current source together form a differential amplifier to operate the actuator responsive to the incoming signal.

28 Claims, 26 Drawing Sheets

(56) References Cited

U.S. PATENT DOCUMENTS

| | | |
|---|---|---|
| 7,330,709 B2 | 2/2008 | Bertin |
| 7,412,428 B2 | 8/2008 | Nugent |
| 7,420,396 B2 | 9/2008 | Nugent |
| 7,426,501 B2 | 9/2008 | Nugent |
| 7,436,033 B2 | 10/2008 | Park et al. |
| 7,439,562 B2 | 10/2008 | Auvray et al. |
| 7,452,759 B2 | 11/2008 | Sandhu |
| 7,456,625 B2 | 11/2008 | Kimura et al. |
| 7,473,943 B2 | 1/2009 | Mostarshed et al. |
| 7,538,337 B2 | 5/2009 | Hijzen et al. |
| 7,838,809 B2 | 11/2010 | Ludwig |
| 7,858,918 B2 | 12/2010 | Ludwig |
| 8,513,741 B2 * | 8/2013 | Keshavarzi et al. ............ 257/369 |
| RE44,469 E * | 9/2013 | Ludwig ..................... 250/214 A |
| 8,669,791 B2 * | 3/2014 | Kimura et al. ................. 327/108 |
| 8,671,370 B2 * | 3/2014 | Ludwig ......................... 716/100 |
| 2002/0001905 A1 | 1/2002 | Choi et al. |
| 2003/0042406 A1 | 3/2003 | Charbon |
| 2004/0153426 A1 | 8/2004 | Nugent |
| 2004/0162796 A1 | 8/2004 | Nugent |
| 2004/0178849 A1 | 9/2004 | Kimura |
| 2004/0193558 A1 | 9/2004 | Nugent |
| 2005/0015351 A1 | 1/2005 | Nugent |
| 2005/0036905 A1 | 2/2005 | Gokturk |
| 2005/0052894 A1 | 3/2005 | Segal et al. |
| 2005/0111283 A1 | 5/2005 | Kimura et al. |
| 2005/0168905 A1 | 8/2005 | Kimura |
| 2006/0044044 A1 | 3/2006 | Kimura et al. |
| 2006/0065887 A1 | 3/2006 | Tiano et al. |
| 2007/0126668 A1 | 6/2007 | Kimura |
| 2007/0187729 A1 | 8/2007 | Park et al. |
| 2007/0262397 A1 | 11/2007 | Surdeanu et al. |
| 2007/0278388 A1 | 12/2007 | Hirose et al. |
| 2007/0285843 A1 | 12/2007 | Tran |
| 2008/0119016 A1 | 5/2008 | Dubin et al. |
| 2008/0121996 A1 | 5/2008 | Park et al. |
| 2008/0135892 A1 | 6/2008 | Finnie |
| 2008/0159042 A1 | 7/2008 | Bertin et al. |
| 2008/0170169 A1 | 7/2008 | Kimura et al. |
| 2008/0231361 A1 | 9/2008 | Ludwig |
| 2008/0290941 A1 | 11/2008 | Ludwig |
| 2009/0014803 A1 | 1/2009 | Zhu |
| 2009/0072223 A1 | 3/2009 | Awano |
| 2009/0072907 A1 | 3/2009 | Kimura et al. |
| 2009/0084944 A1 | 4/2009 | Hirose et al. |
| 2009/0200541 A1 | 8/2009 | Herman et al. |

OTHER PUBLICATIONS

R. Martel et al., "Single- and multi-wall carbon nanotube field-effect transistors," Applied Physics Letters, vol. 73 No. 17, Oct. 26, 1998, pp. 2447-2449.

Bachtold, A., Hadley, P., Nakanishi, T. and Dekker, C., "Logic Circuits with Carbon Nanotube Transistors," Science, vol. 294, No. Nov. 9, 2001, pp. 1317-1320.

Bethany Halford, "Graphene Ribbons," Chemical and Engineering News, vol. 85, No. 4, Jan. 28, 2008, p. 15.

Gojman, B., Hsin, H., Liang, J., Nezhdanova, N. and Saini, Jasmin, "Y-Junction Carbon Nanotube Implementation of Intramolecular Electronic NAND Gate," Aug. 13, 2004, pp. 1-24.

Goldsmith et al., "Conductance-Controlled Point Functionalization of Single-Walled Carbon Nanotubes," Science, Jan. 5, 2007, vol. 315. No. 5808, pp. 77-81.

Siripruchyanan, M. and Jaikla, W., "Floating Capacitance Multiplier Using DVCC and CCCIIs," ISCIT '07 International Symposium on Communications and Information Technologies, Oct. 17-19, 2007, Sydney, pp. 218-221.

J. Han, X.Liu, C. Lee, C. Zhou, "Carbon nanotube field-effect inverters," Applied Physics Letters, vol. 79 No. 20, Nov. 12, 2001, pp. 3329-3331.

"Bell Labs Scientists Usher in New Era of Molecular-Scale Electronics," Space Daily: your portal to space, Oct. 17, 2001, 2 pages.

V. Derycke, R. Martel, J. Appenzeller, Ph. Avouris, "Carbon Nanotube Inter- and Intramolecular Logic Gates," Nano Letters, Aug. 16, 2001, 4 pages.

Richardson, W. H., "Analysis of Carbon Nanotube Intramolecular p-n Tunnel Junction Transistors," 2003 Third IEEE Conference on Nanotechnology, 2003, pp. 753-755.

Sachdev, C., "Nanotube Kinks Control Current," Technology Research News, copyright 2000-2006, 2 pages.

Will Knight, "Y-shaped Nanotubes are Ready-made Transistors," NewScientist.com, Jan. 29, 2007, available at http://www.newscientist.com/article.ns?id=dn7847, 2 pages.

Petchakit, W. and Petchakit, S., "New Floating Capacitance Multipliers," Proceedings of 28th Electrical Engineering Conference (EECON-28), vol. 2, Phuket, Thailand, pp. 1233-1236, 2005.

"Nanotube diode proves multifunctional," General Electric Global Research, Jul. 13, 2004, reported in http://nanotechweb.org/cws/article/tech/19870, 2 pages.

Ji Ung Lee, Photovoltaic effect in ideal carbon nanotube diodes,: Applied Physics Letters 87, 073101, 2005, 3 pages.

* cited by examiner

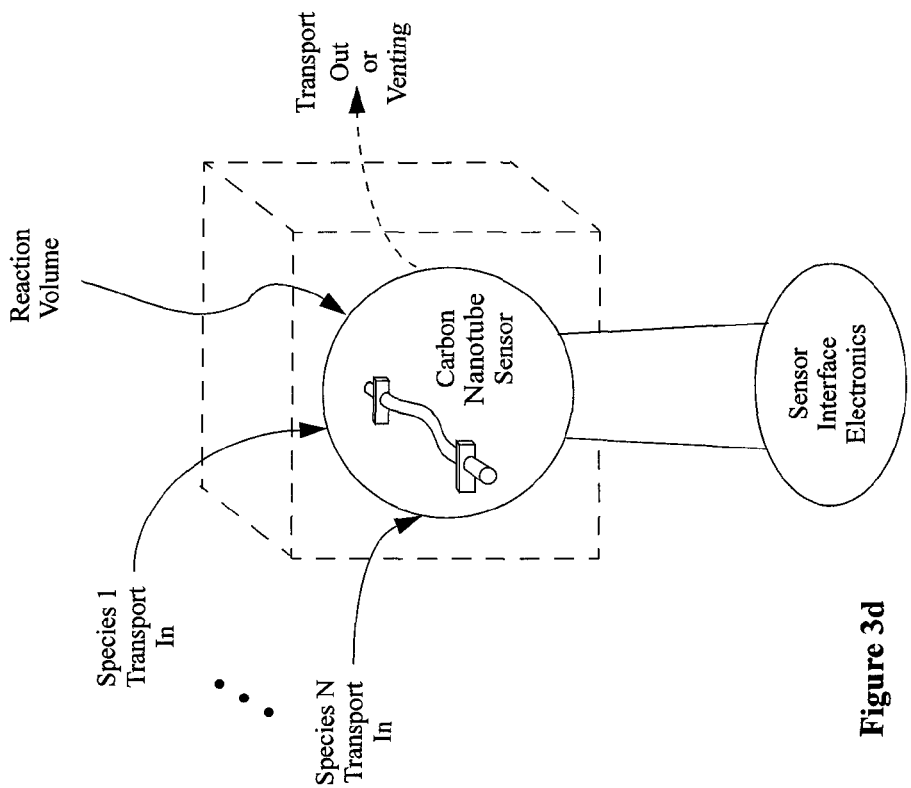
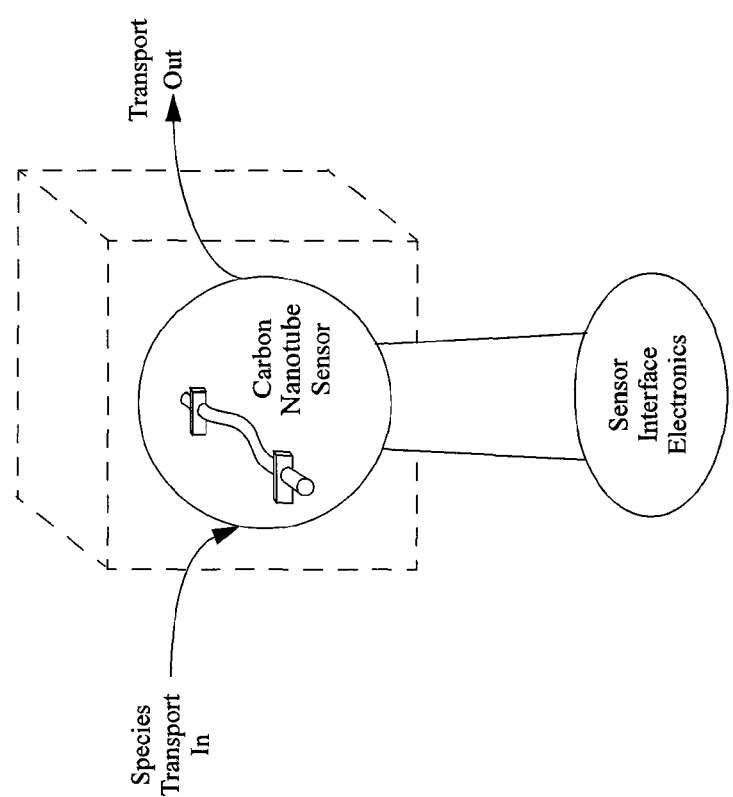
Figure 3d
Figure 3c

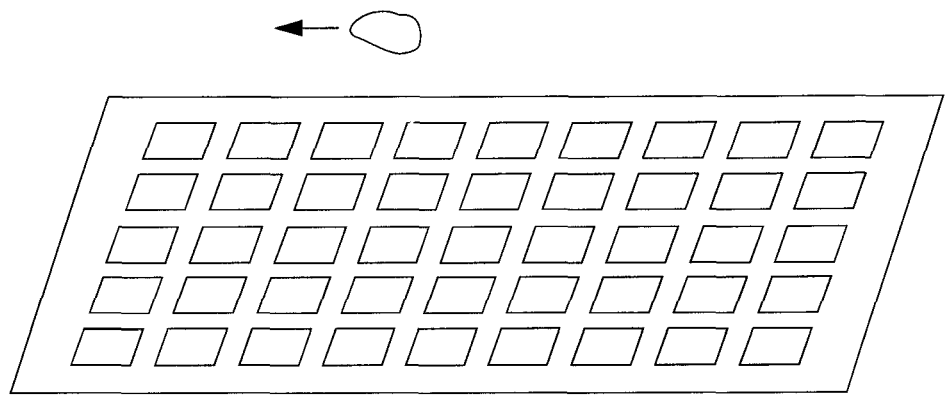
Figure 4
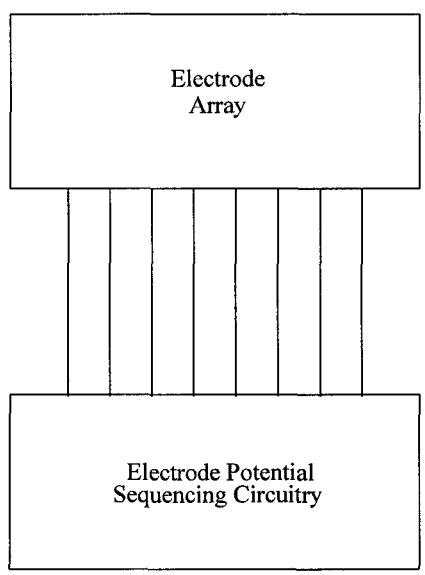 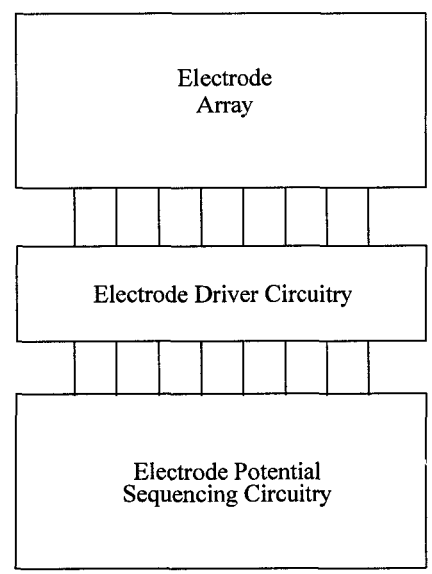
Figure 5a  Figure 5b

MOLECULAR TRANSISTOR DRIVING OF NANOSCALE ACTUATORS FROM DIFFERENTIAL AMPLIFIER CIRCUITS COMPATIBLE WITH CARBON NANOTUBE SENSORS AND TRANSDUCERS

CROSS-REFERENCE TO RELATED APPLICATIONS

The present application is a continuation of U.S. application Ser. No. 12/025,562, filed Feb. 4, 2008 (now U.S. Pat. No. 7,858,918), which claims priority to U.S. Provisional Appl. No. 60/899,667, filed Feb. 5, 2007; the disclosures of each of the above-referenced applications are incorporated by reference herein in their entireties.

BACKGROUND OF THE INVENTION

1. Field of the Invention

The present invention generally relates to nanotechnology, and in particular, to carbon nanotube electronics, actuators, and sensors.

2. Background of the Invention

For decades the civilization-changing electronics industry implemented first germanium (Group IV-A metal element), then silicon (Group IV-A non-metal element), and to some extent Group III-A/Group V-A combinations (such as gallium-arsenide and indium-phosphide). One application of such materials is to move large quantities of electrons within semiconducting junctions and lattices as signifiers of signals and quantities subject to transport, storage, and transformative operations. Nature has worked at a much grander scale with far more selfsustainable results using chemical reaction and electrical properties of carbon (Group IV-A nonmetal element). Since Sumio Iijima's discovery of (multi-wall) carbon nanotubes in 1991, which is based on the Buckminsterfullerene (C60) by Richard Smalley and team, the subsequent 1993 discoveries of single-wall carbon nanotubes by a number of separate research groups, and the first studies of the electrical properties of these, carbon lattices have rapidly risen to a position to form a new platform for electronics in a manner that gracefully inherits the accumulated quantum theory and design conceptualizations of the now well-entrenched semiconductor dogmas and methodologies. Although other types of molecular electronic materials, substrates, and methods await study and development, carbon nanotube electronics has captured considerable funding support and scientific research attention. Additionally, being carbon-based, there is the potential for future leverage of carbon-based electronics in deep and profound ways with carbon-based organic and bioorganic chemical processes.

SUMMARY OF THE INVENTION

Features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In accordance with an embodiment, small-signal and other circuit design techniques may be realized by carbon nanotube field-effect transistors (CNFETs) to create analog electronics for analog signal handling, analog signal processing, and conversions between analog signals and digital signals. As the CNFETs exist and operate at nanoscale, they can be readily collocated or integrated into carbon nanotube sensing and transducing systems. Such collocation and integration is at, or adequately near, nanoscale.

These and other embodiments will also become readily apparent to those skilled in the art from the following detailed description of the embodiments having reference to the attached figures, the invention not being limited to any particular embodiment disclosed.

BRIEF DESCRIPTION OF THE DRAWINGS

The above and other aspects, features, and advantages of the present invention will become more apparent upon consideration of the following description of preferred embodiments, taken in conjunction with the accompanying drawing figures.

FIGS. 3a-3d illustrate various situations wherein a carbon nanotube sensor, positioned within a measurement volume, is subjected to physical phenomena, and in one example, the presence of a chemical species. Other phenomena, such as temperature, pressure, conductivity, optical transmission, pH, etc., may also be measured in such a manner.

FIG. 4 illustrates the transport of a micro-scale or smaller droplet via sequenced electric field transport as has been proposed for reconfigurable and other Lab-on-a-Chip and microfluidic/nanofluidic implementations.

FIGS. 5a and 5b show the transport electrode array of the droplet transport arrangement of FIG. 4 interconnected with sequencing and driving electronics.

FIG. 7b is a cross-sectional view of the arrangement of FIG. 7a.

FIG. 8b illustrates a cross-sectional view of the arrangement of FIG. 8a.

DETAILED DESCRIPTION OF THE PREFERRED EMBODIMENTS

Figure 1A:
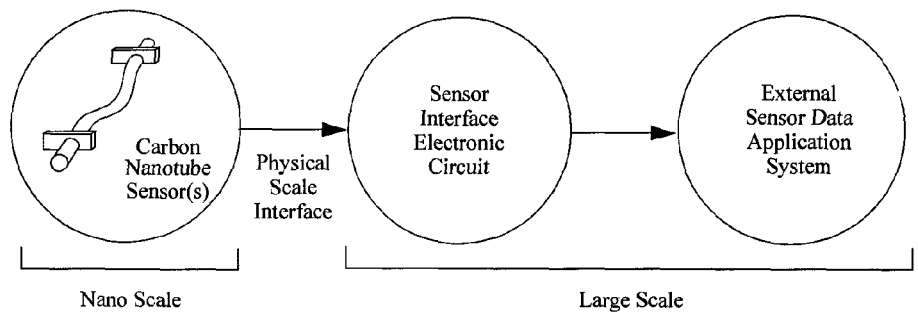
FIGS. 1a through 1f illustrate various element scalings for carbon nanotube sensors, interface electronics, and application systems.

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

Contemporary carbon nanotube (and graphene) electronics has yielded to humanity field-effect transistors (with promises of other future junction, tunneling, magnetic, and spintronic active devices), light emitting structures, nanoscale electromechanical transducers, nanoscale electromechanical relays, light sensing structures, and a wide variety of nanoscale phenomenological sensing devices. A wide range of experimentally observed phenomena and initial engineering is being cataloged daily, and early conceptualizations and studies of commercially-viable fabrication techniques are often co-proposed with these findings and offerings.

Carbon nanotubes comprise a somewhat broad class of materials. In the organic chemistry and biochemistry found throughout nature, carbon atoms ready link themselves in chains and rings involving one (as in alkanes such as methane), two (as in alkenes such as ethane), or even three (as in alkynes such as ethyne) of their four covalent bonds. Carbon can also link all four bonds with itself, occurring naturally in the long-known 3-dimensional lattice forms (allotropes) of diamonds and graphite and more recently (and perhaps less prevalent in Nature) 2-dimensional lattice form of graphene. Graphene lattices may be arranged in 3-dimensional shapings of their 2-dimensional lattice so that the sheet's "edges" seamlessly connect to themselves to form spheroids (fullerenes), tubes (carbon nanotubes), and cones (carbon nanohorns).

In the case of tubes, the "joining" of the edges of the graphene sheet may be straight-across to result in materials that electrically behave as metals, or made at various angles to cause a twisting (thought of geometrically as helicity, and chemically as chirality) to result in materials that electrically behave as semiconductors. Additionally, carbon nanotubes, as mentioned earlier, may be created in single-wall and multiwall varieties. Of the wide range of devices crafted from carbon nanotubes, many involve constraints as to the number of walls (at least single-wall versus multiple-wall) and type of helicity/chirality (usually at least metal versus semiconductor).

As a first observation, given the small size of carbon nanotubes it is highly likely that a given commercially-fabricated substrate will be most commercially-viable if a single type of carbon nanotube material is employed.

Further, in the case of carbon nanotube sensors and transducers, conventional consideration to interfacing to the larger-scale world of exogenous signal processing and control systems that would co-operate with these miraculous small devices is virtually or completely non-existent. One advantage of nanoscale molecular electronics (including carbon nanotube electronics) is that the degradation of signals and measurements due to thermal and other electrical noise is highly reduced due in part to the smaller electron counts involved in nanoscale electronic device operation. With poor interfacing to the larger-scale world, the valuable gifts and opportunities offered by the sensitivities and signal integrity of these nanoscale devices is easily (and perhaps literally) would otherwise be lost in the noise.

Thus, as a second observation, recognized benefits relate to signal conditioning, signal processing, and control electronics that are compatible with and complementary to the signal integrity of carbon nanotube sensors and transducers. In some circumstances such signal conditioning, signal processing, and control electronics would be purposed to work only with nanoscale devices. In other circumstances such signal conditioning, signal processing, and control electronics would provide high-integrity interfacing between nanoscale devices and the larger-scale world of exogenous systems.

In accordance with various embodiments, features relating to the first and second observations may be implemented to combine carbon nanotube sensors and transducers with nanoscale molecular electronics, and to the extent possible use the same type of carbon nanotube material for both.

Further as to the desirable requirements for this, many of the devised and proposed carbon nanotube sensors, and some proposed carbon nanotube transducers, utilize signals whose voltage and/or current vary over what amounts to a continuous range (or at least a large number) of values, that is, they involve analog signals. It is understood that the present disclosure is not limited to carbon nanotube electronic circuits which focus on logic circuitry (i.e. binary-values or digital signals).

Thus as a third observation, in accordance with embodiments of the present invention, the above described nanoscale molecular electronics made be formed using compatible material as possible to additionally include high-quality analog signal handling and analog signal processing capabilities. In some circumstances only analog signal handling and signal processing will be involved. In other circumstances, analog signals must be converted to (and/or fkom) digital signals.

Embodiments of the present invention provide a number of benefits. For instance, field-effect transistors may be readily crafted fkom at least single-wall carbon nanotubes ("SWCN) and to some extent multi-wall carbon nanotubes ("MWCN) as is explained in "Single- and Multi-Wall Carbon Nanotube Field-Effect Transistors" R., Martel et al., Applied Physics Letters, Vol. 73 No. 17, Oct. 26, 1998 and many subsequent works known to those skilled in the art. Further, such field-effect transistors operate in both classical enhancement and depletion modes, for example exhibiting typical (for example "square-law") voltage-current characteristics associated with common EETs and MOSFETs used for many years in discrete and monolithic electronics of both analog and digital varieties. Further, it is known that carbon nanotube fieldeffect transistors can carry very high currents relative to their size (large integer multiples to that of silicon and in some cases even copper wire).

As such, embodiments will be described in which "small-signal" and other circuit design techniques are applied to carbon nanotube field-effect transistors ("CNFETs") to create analog electronics for analog signal handling, analog signal processing, and conversions between analog signals and digital signals. As CNFETs exist and operate at nanoscale, that can be readily collocated or integrated into carbon nanotube sensing and transducing systems, wherein said collocation or integration is at or adequately near nanoscale.

Further, these techniques may also be applied to other types of carbon-based transistors, such as the gold/thiol molecular transistor pioneered by Schon, Bao, and Meng at Lucent Technologies' Bell Labs. It is noted that this Bell Labs organic transistor is thought to be readily fabricated. See, for example, the publication by Saswato Das, Lucent technologies, entitled "Bell Labs Scientists Usher in New Era of Molecular-Scale Electronics," http://www.eurekalert.org/pub_releases/2001_10/ltl-blsl101501.php."

Carbon nanotubes have been used for a large variety of nanoscale phenomenological sensing devices. Many of the devised and proposed carbon nanotube sensors, and some proposed carbon nanotube transducers, utilize signals whose voltage and/or current vary over what amounts to a continuous range (or at least a large number) of values (i.e., they involve analog signals).

Further features that will be described herein relate to interfacing to the larger-scale world of exogenous signal processing and control systems that would co-operate with these miraculous small devices. In particular, one advantage of nanoscale molecular electronics (including carbon nanotube electronics), is the recognized fact that the degradation of signals and measurements due to thermal and other electrical noise is highly reduced due in part to the smaller electron counts involved in nanoscale electronic device operation. However, with poor interfacing to the larger-scale world, the valuable gifts and opportunities offered by the sensitivities and signal integrity of these nanoscale devices is easily (and perhaps literally) lost in the noise.

Figure 1B:
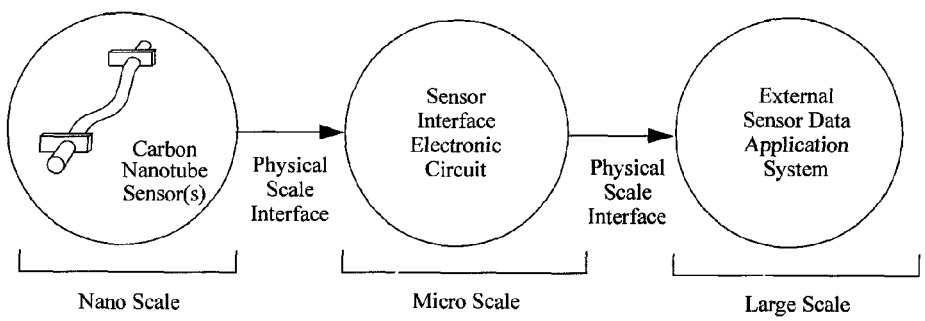
Figure 1C:
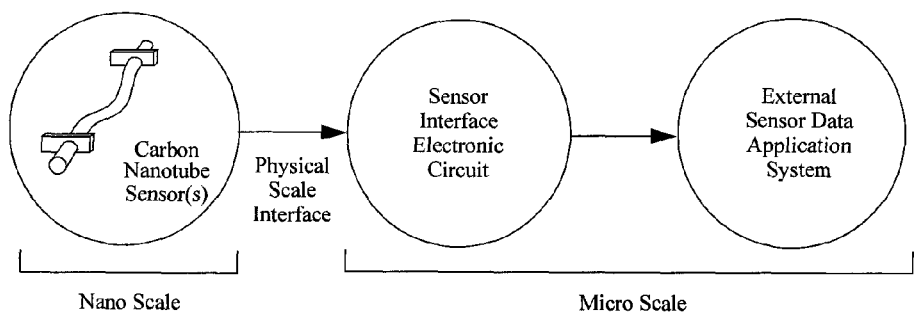

FIGS. 1a, 1b, and 1c illustrate various scenarios typically assumed in the interfacing of these inherently analog devised and proposed carbon nanotube sensors and carbon nanotube transducers. Clearly these are indeed completely at risk to poor interfacing to the larger-scale or micro-scale world and associated implications raised above, due at least to the presence of the physical-scale interface directly to the carbon nanotube sensor or transducer.

Thus there is a need for signal conditioning and signal processing that is compatible with and complementary to the signal integrity of carbon nanotube sensors and transducers. In some circumstances such signal conditioning, signal processing, and control electronics would provide high-integrity interfacing between nanoscale devices and the larger-scale world of exogenous systems. These features are depicted in FIGS. 1e and 1f. In other circumstances the signal conditioning and signal processing electronics may be implemented to work only with other nanoscale devices, as depicted in FIG. 1g.

To address this scenario, the first opportunity noted is that field-effect transistors may be readily crafted from at least single-wall carbon nanotubes ("SWCN) and to some extent multiwall carbon nanotubes ("MWCN) as is explained in "Single- and Multi-Wall Carbon Nanotube Field-Effect Transistors" R., Martel et. al., Applied Physics Letters, Vol. 73 No. 17, Oct. 26, 1998 and many subsequent works known to those skilled in the art. Numerous types of carbon nanotube field-effect transistors have been devised, reported, characterized, and modeled. (Note carbon nanotube field-effect transistors are not to be confused with carbon nanotube field-emission transistors, the latter functionally similar to classical electronic vacuum tubes of generations past).

It is conventionally understood that carbon nanotube electronic circuits are implemented with a focus on logic circuitry (i.e., all signals are binary-valued digital signals). However, most known carbon nanotube field-effect transistors have been measured and seen to readily possess wide rich regions of classical enhancement and depletion modes, for example exhibiting typical (for example "square-law") voltage-current characteristics associated with common junction gate field-effect transistors (JFETs) and metal-oxide-semiconductor field-effect transistors (MOSFETs). An example of this is described in a publication by Bachtold, A., Hadley, P., Nakanishi, T., and Dekker, C., entitled "Logic Circuits with Carbon Nanotube Transistors," Science, Vol. 294, No. 9, November 2001, pg. 13 17-1320.

Common JFETs and MOSFETs have been used for many years in discrete and monolithic electronics of both analog and digital varieties. It is recognized that because these analog field-effect transistor (FET) characteristics are similar to widely familiar MOSFETs, well-known MOSFET analog integrated circuit designs may be adapted for use in implementations comprising carbon nanotube FETs (CNFETs) as active elements. However, to date, there seems to have been no recognition any of the forgoing problems, much less any of the solutions provided herein.

Further, many classical FET-based implementations of analog circuits such as buffer amplifiers, current sources, differential amplifiers, operational amplifiers, comparators, voltage sources, etc. (as well as larger circuit structures built from these), employ direct connects between the sources and drains of pairs of FETs. Accordingly, in accordance with various embodiments, various circuit topologies can be exploited or devised so that a single carbon nanotube may be used to implement several interconnected FETs. Additional techniques may be used in some circumstances to implement several otherwise electrically separate analog circuit elements with a common carbon nanotube.

Carbon nanotube FET analog circuit implementations can additionally benefit from two further powerful properties of carbon nanotubes involving electron carrier and heat transport. As to the first of these, it is known that many types of carbon nanotube field-effect transistors can carry very high currents relative to their size (large integer multiples to that of silicon and in some cases even copper wire). These large current carrying capacities considering relative physical size makes them an excellent match for driving physical-scale interfaces with microscale or large-scale systems as depicted in FIGS. 1e and 1f. As to the second of these, carbon nanotubes have excellent heat transmission properties, allowing for the ready implementation of heat sink arrangements.

As such, one feature of the present invention applies "small-signal" and other circuit design techniques to carbon nanotube field-effect transistors ("CNFETs") to create analog electronics for analog signal handling, analog signal processing, and conversions between analog signals and digital signals. As the CNFETs exist and operate at nanoscale, that can be readily collocated or integrated into carbon nanotube sensing and transducing systems, such collocation or integration that is at or adequately near nanoscale. These aspects provide for the use of both enhancement and depletion CNFETs.

Additionally, it is noted that a large variety of actuators and controller devices utilizing carbon nanotubes have been devised and proposed. Many of these would also benefit from similar sorts of analog electronic circuitry, i.e., employing carbon nanotube transistors to implement analog circuits such as buffer amplifiers, current sources, differential amplifiers, operational amplifiers, comparators, voltage sources, and the like, as well as larger circuit structures built from these. As carbon nanotube field-effect transistors again can carry very high currents relative to their size and have excellent heat transmission properties, it has been recognized that such properties allow for the ready implementation in heat sink arrangements. In addition, analog mode carbon nanotube field-effect transistor circuits provide an excellent choice for drive circuits that would operate carbon nanotube actuators and controllers devices.

Figure 1D:
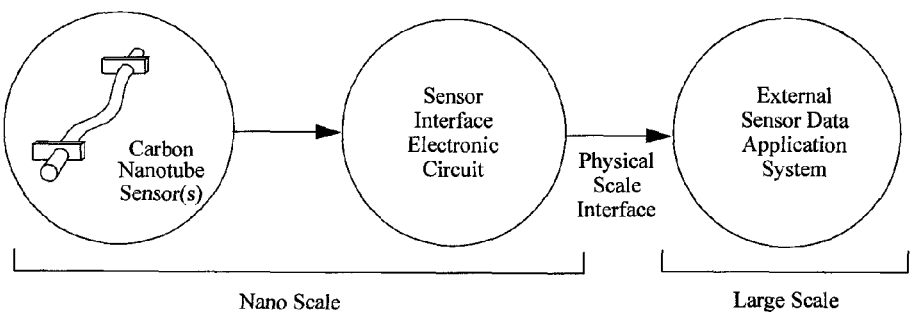
Figure 1E:
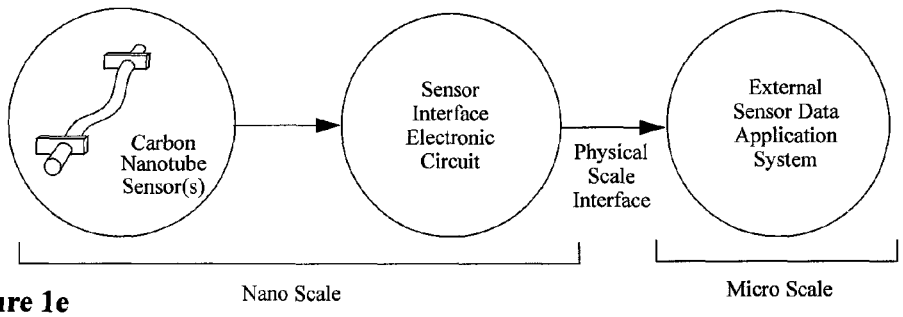
Figure 1F:
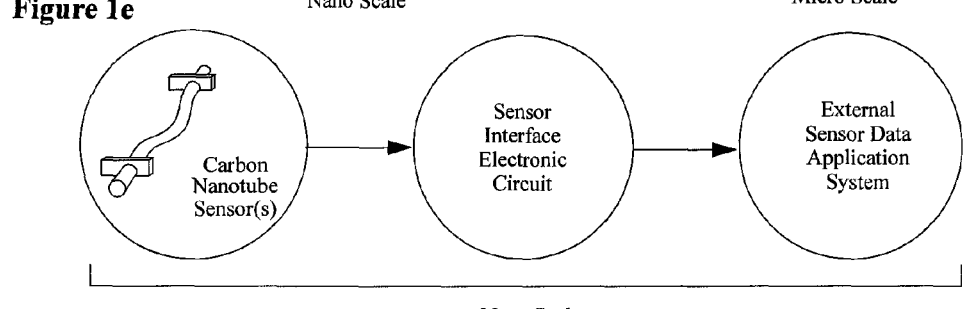
Figure 1G:
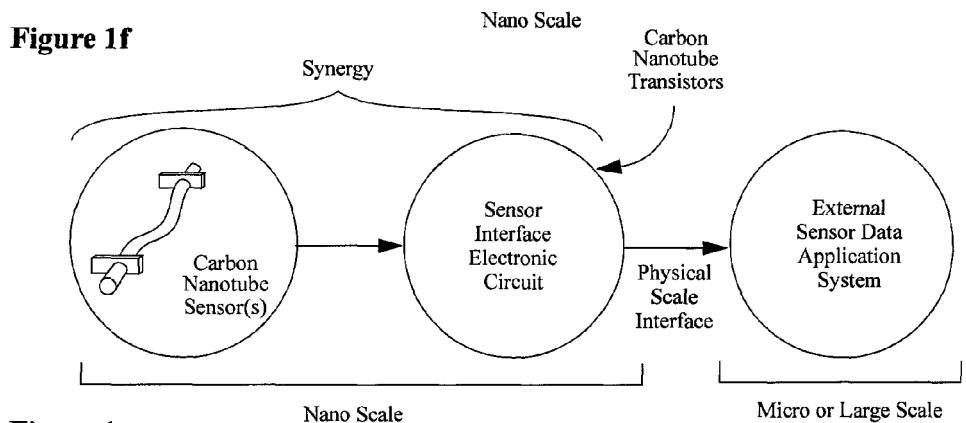
FIGS. 1g and 1h illustrate the existence of opportunities for valuable synergies when the sensor interface electronics is at the same or similar scale as carbon nanotube sensors, particularly if the sensor interface electronics is implemented with carbon nanotube transistors.

These observations and conclusions lead to not only systems involving sensors and circuits comprised of carbon nanotubes, depicted in FIGS. 1d and 1e, but full systems involving other types of carbon nanotube devices and structures such as actuators, controllers, heat transport elements, fluid transport elements, and the like, depicted in FIG. 1f.

Figure 2:
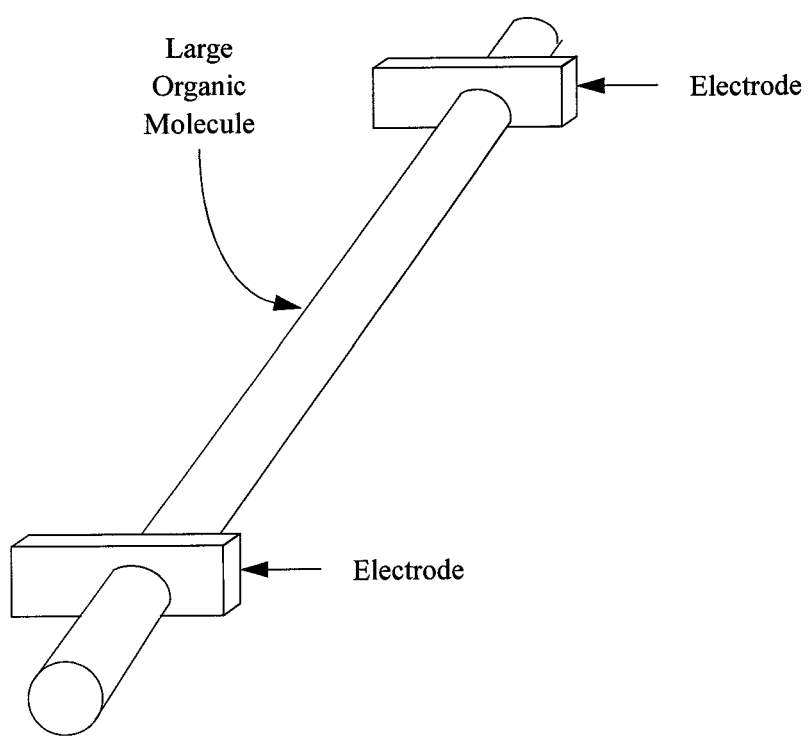
FIG. 2 illustrates an exemplary carbon nanotube chemical species specific or affinity sensor created from a carbon nanotube with electrode connections at either end of a portion of its length with a large organic molecule, typically with affinity properties, positioned between the electrode connections.

Further, some types of carbon nanotube sensors may be viewed as a variation on a field effect transistor. FIG. 2 shows such an example, although there are many others. Specifically, FIG. 2 shows an affinity chemical species sensor wherein a (typically large) organic molecule with chemical affinity properties is attached to a carbon nanotube at a position located between two separated electrode terminals that contact the same carbon nanotube. In this view as a modified field effect transistor, chemical reactivity of the attached organic molecule causes changes in the electric field in the vicinity of the attachment point and thus affects the current flow through the carbon nanotube. Such sensors have been reported by, among others, Collins, Goldsmith, Coroneus, et al. in Science 2007, 315, 77. This process of varying the current through the carbon nanotube as a function of the electric field in a region between two electrically terminating electrodes is very similar to the actions within a carbon nanotube field effect transistor. (Similar types of semiconductor field effect chemical sensors employing silicon-based semiconductor structures are often referred to as "bioFETs").

Figure 1H:
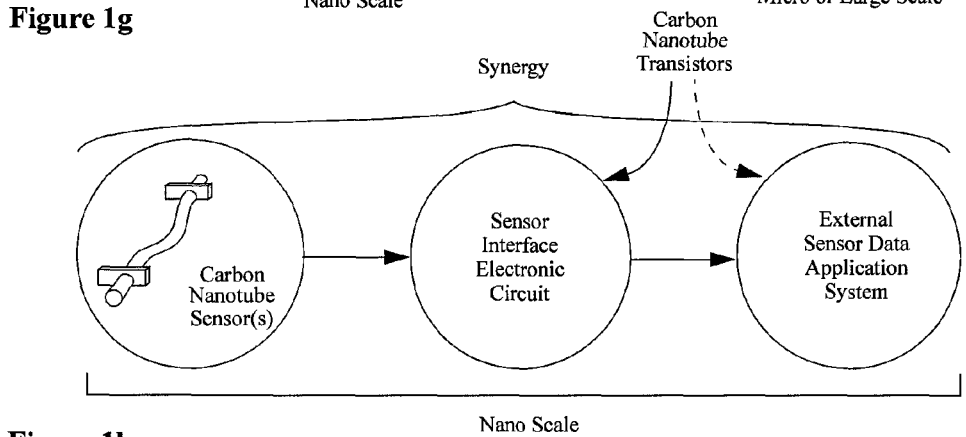

As a result, these and other types of carbon nanotube sensors may be used in place of an analog FET in analog circuits such as differential amplifiers, op amps, comparators, and the like. This gives rise to a first kind of synergy between carbon nanotubes used as sensors and those used as circuit elements. A second kind of synergy may be found in using the same carbon nanotube for several circuit elements as described earlier. These opportunities for synergies between carbon nanotube sensors and sensor interface electronic circuits implemented using carbon nanotube FETs are depicted in FIGS. 1g and 1h.

Similarly, there may be analogous first kind synergies and second kind synergies between other types of carbon nanotube devices and structures such as actuators, controllers, heat transport elements, fluid transport elements, and the like, and carbon nanotubes used as field effect transistors and other circuit elements. At a minimum, nanoscale implementations of sensor data application systems may separately and internally incorporate carbon nanotubes used as field effect transistors or other circuit elements. These opportunities for synergies between nanoscale implementations of sensor data application systems utilizing carbon nanotubes and sensor interface electronic circuits implemented using carbon nanotube FETs are depicted in FIG. 1g.

Further embodiments provide opportunities for even richer synergies among carbon nanotube sensors, sensor interface electronic circuits implemented using carbon nanotube FETs, and sensor data application systems utilizing carbon nanotubes. For example, a single carbon nanotube may, in different regions, be used to implement elements such as sensors, sensor interface electronics, and sensor data application systems. There may also be opportunities to use the same carbon nanotube segment as a single elementary device that serves simultaneously, or substantially simultaneously, as a sensing transducer for phenomenon A (for example chemical affinity or magnetic fields), an emitting transducer for phenomenon B (for example photons), and a circuit element effectively providing an interfacing electronics function between these roles.

Before discussing analog electronics, attention is directed to some non-limiting examples as to how carbon nanotube sensors may be incorporated into aggregate systems to which the situations depicted in FIGS. 1c through 1g, for example, pertain.

To begin, examples of carbon nanotube sensors provided for by embodiments of the invention include, among others:
- chemical species sensor or affinity sensor;
- chemical reaction sensor;
- gas detection sensor;
- fluidic flow sensor (an example is described in a publication by Ghosh S. et al., entitled "Carbon Nanotube Flow Sensors," Science Express, Vol. 299, pg. 1042-1044, February 2003");
- temperature sensor;
- gas pressure sensor;
- contact pressure sensor;
- mechanically resonating sensor; and
- optical sensor.

Examples of the above elements are described in a publication by Dai, L., Soundarrajan, P., and Kim, T., entitled "Sensors and Sensor Arrays Based on Conjugated Polymers and Carbon Nanotubes," from Pure Appl. Chem., Vol. 74, No. 9, pg. 1753-1772 2002, and are also disclosed in U.S. Pat. No. 7,129,554, issued Oct. 31, 2006.

Examples of carbon nanotube transducers provided for by embodiments of the invention include, among others:
- light-emitting transducers;
- optical processing transducers;
- mechanical displacement transducers;
- mechanical vibration transducers;
- fluidic valve operation transducers;
- mechanical fluidic transport transducers (such as a pump);
- controllable electric field fluidic transport transducers.

FIGS. 3a through 3d depict various situations wherein a carbon nanotube sensor (including a carbon nanotube transducer acting as a sensor) positioned within a measurement volume is subjected to physical phenomena. For example, the sensor positioned within a measurement volume may be the carbon nanotube affinity sensor described in conjunction with FIG. 2 and may be subjected to the presence of a chemical species. Other types of sensors, such as temperature, pressure, conductivity, optical transmission, pH, etc., may also be employed in a similar manner. In each of these figures, the carbon nanotube sensor is shown connected with sensor interface electronics.

Figure 3B:
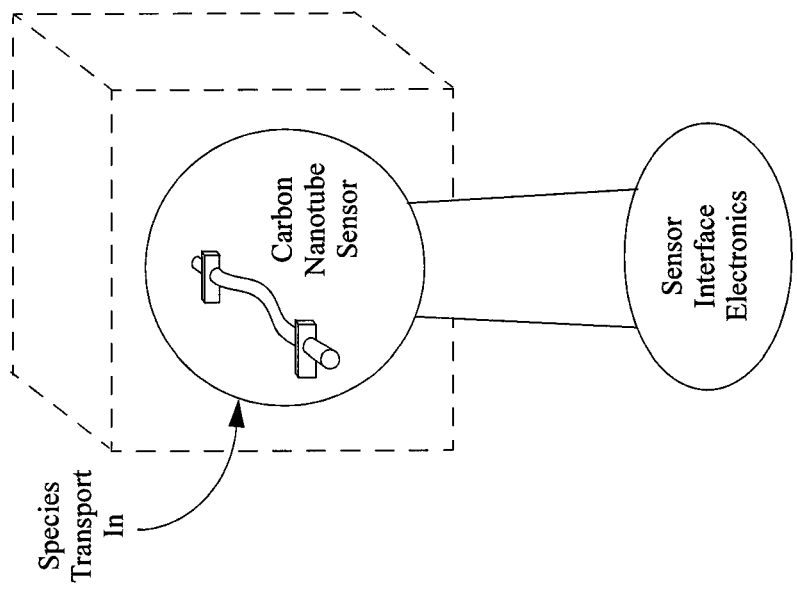
Figure 3A:
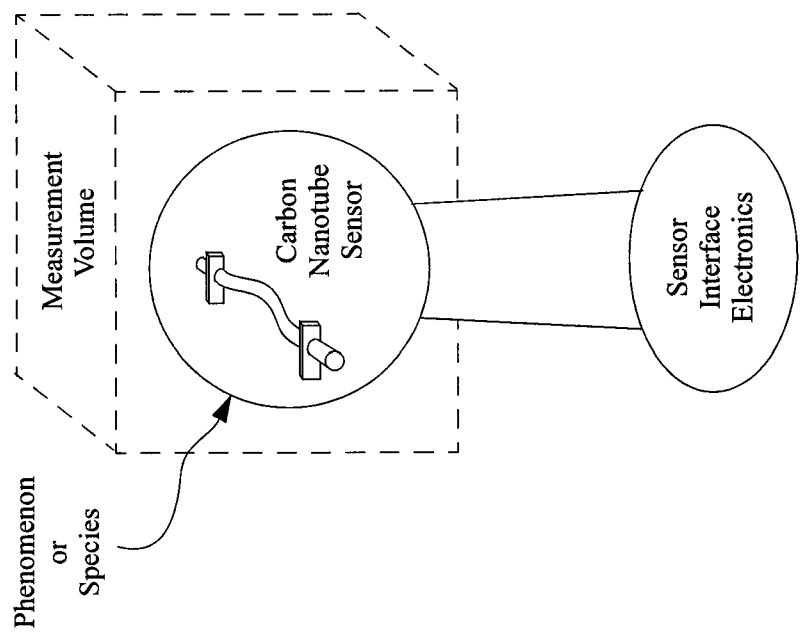

In FIG. 3a, a carbon nanotube sensor is shown embedded in a measurement environment wherein the carbon nanotube sensor is exposed to an ambient phenomenon or species that it may be responsive to. For example, it may be used to measure the presence of hydrogen, pressure, or temperature, in gas contained within the measurement environment.

FIG. 3b depicts a carbon nanotube sensor in a measurement environment accepting the structured transported inflow of a species for scrutiny by the sensor. For example, this may be a vacuum volume opened to draw in atmospheric samples or liquids.

FIG. 3c depicts a carbon nanotube sensor in a flow-through measurement environment accepting the structured transported inflow and outflow of a species for scrutiny by the sensor.

FIG. 3d depicts a carbon nanotube sensor in a measurement environment that also serves as a reaction chamber that accepts the structured transported inflow of two or more species that react with each another to create reaction products or effects presented to the sensor. Such an arrangement may additionally provide for transport outflow or venting as depicted in the figure. Any of the arrangements shown in FIGS. 3a-3d may serve as a stand alone component, or comprise a component within a more comprehensive system, such as in a Lab-on-a-Chip device, for example.

In the arrangements of FIGS. 3a-3d, any of the depicted species transport may be driven by pressure, capillary force, electro osmosis, etc., using structured channels, conduits, and the like. Alternatively, species transport may be realized by sequenced electric-field transport as micro-droplets/nano-droplets, multipath gel-medium electrophoresis, etc. As an example of the use of carbon nanotube sensors with these alternate transport technologies, FIG. 4 depicts an isolated droplet moving over an electrode array by means of modulated electric fields created by sequencing the electric potential applied to individual electrodes in the electrode array. Depending on the voltages and transient currents required, together with the types of electronic components and circuitry used for the time-varying sequencing of electrode electrical potential, individual electrodes within the electrode array may be either driven directly from electrode potential sequencing circuitry, such as that which is shown in FIG. 5a, or indirectly by surrogate electrode driver circuitry controlled by the electrode potential sequencing circuitry, such as that shown in FIG. 5b. Such sequenced electric-field droplet transport may simultaneously move many isolated droplets in various directions, inducing isolation between droplets or collisions that result in mixing and chemical reactions without the use of mixing or reaction chambers.

Figure 6A:
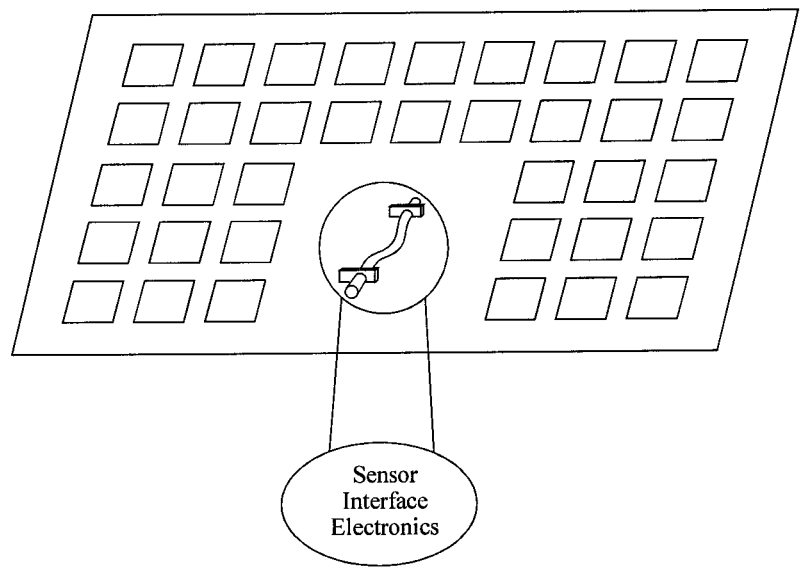
FIG. 6a shows a carbon nanotube sensor located in a region served by an adaptation of the droplet transport arrangement of FIG. 4.

FIG. 6a depicts the embedding of a carbon nanotube sensor into a region sufficiently served by a sequenced electric-field droplet transport environment. In such an arrangement droplets may be transported into the vicinity of the sensor, or directly to the sensor. The droplet may be left in the region for a considerable length of time (similar to the functionality provided in the arrangement of FIGS. 3a and 3b), or be transported by the sensor to obtain an in-flow measurement (similar to the functionality provided in the arrangement of FIG. 3c).

Two or more droplets may be combined in the vicinity of the sensor or in direct contact with the sensor to create a bigger droplet or to obtain mixing or chemical reaction (similar to the functionality provided in the arrangement of FIG. 3d). Sensor interface electronics are connected to the carbon nanotube sensor. For layout reasons or for isolation from the effect of the electric fields produced by the sequenced electric-field droplet transport environment, the sensor interface electronics may be located some distance away from the carbon nanotube sensor.

In general it is noted that operation of the sequenced electric-field droplet transport environment may produce electric fields that could affect or impede the operation of the carbon nanotube sensor. Shielding may be used, or with appropriate design the sensor operation and electric fields produced by the sequenced electric-field droplet transport environment may be carefully time-multiplexed. Alternatively, the disturbance created by the electric fields produced by the sequenced electric-field droplet transport environment may be compensated for in subsequent processing of the sensor measurement. In another embodiment, the carbon nanotube sensor itself may be raised to an electrical potential so that it may effectively serve as a surrogate "electrode" in the sequenced electric-field droplet transport environment.

Figure 6B:
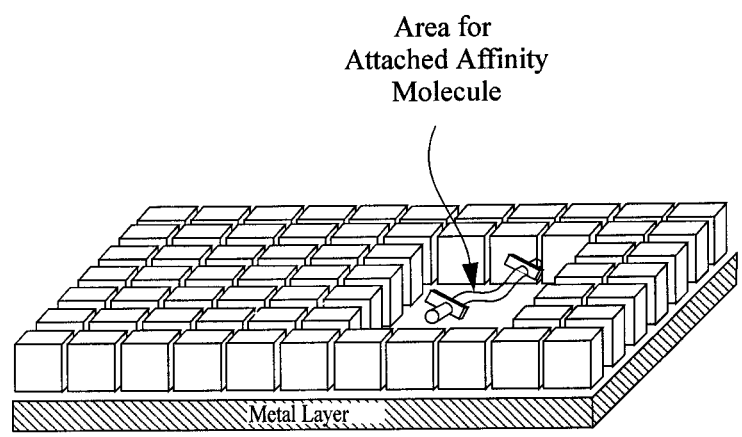
FIG. 6b shows another depiction of the general arrangement of FIG. 6a, here with an exemplary carbon nanotube affinity sensor such as that depicted in FIG. 2.

FIG. 6b shows another depiction of the general arrangement of FIG. 6a, here with an exemplary carbon nanotube affinity sensor such as that depicted in FIG. 2. In this arrangement, the susceptibility of a carbon nanotube sensor operation to electric fields produced by the sequenced electric-field droplet transport environment is quite apparent. The affinity sensing requires sensitivity to variations in electric fields resultant from activities of the attached affinity molecule, while the sequenced electric-field droplet transport environment requires electric fields high enough to result in droplet motion.

Figure 7A:
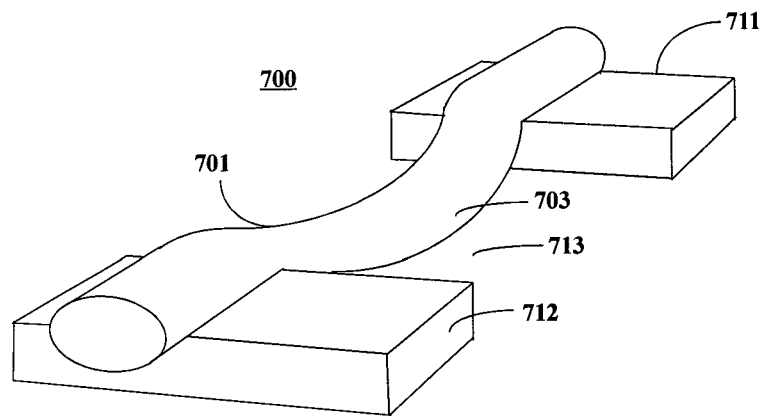
FIG. 7a depicts a carbon nanotube N-channel field effect transistor comprising a carbon nanotube draped between two electrodes over an underlying insulated gate area.

FIG. 7a depicts a carbon nanotube N-channel field effect transistor 700 comprising a carbon nanotube 701 draped between two electrodes 711, 712 over an underlying insulated gate area 713. Current through the carbon nanotube 701 via its two electrodes 711, 712 is determined by the electric field between the underlying insulated gate area 713 and the local volume 703 of the nanotube 701. The device shown in this figure is symmetric and either electrode 711, 712 may serve as source or drain. In some embodiments, other geometries may be used so one electrode may be a more preferable choice for source or drain functions.

Figure 7B:
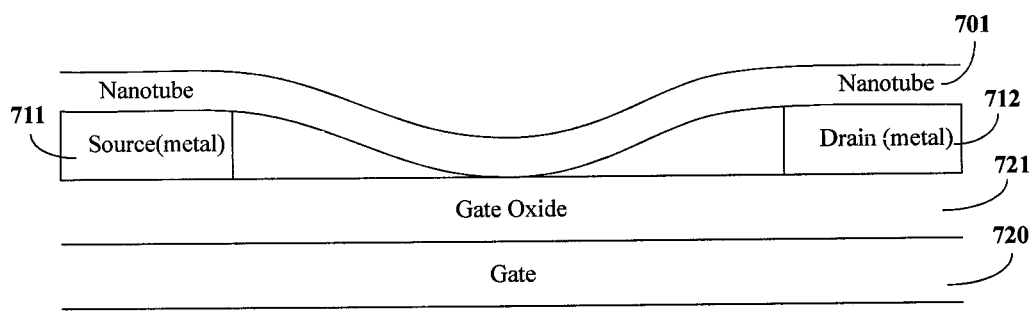
Figure 7C:
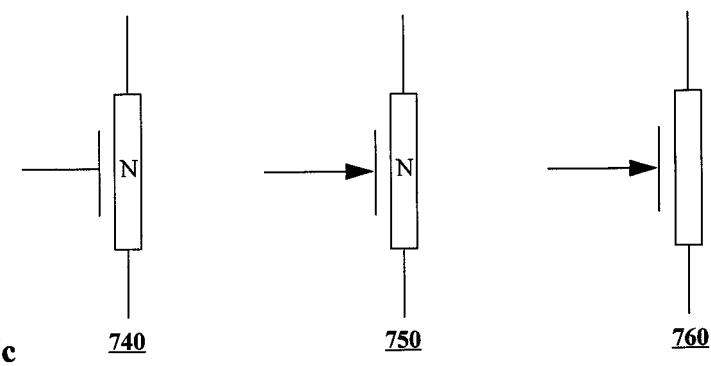
FIG. 7c depicts symbols that may be used to depict a carbon nanotube N-channel field effect transistor in circuit diagrams.

FIG. 7b illustrates a cross-sectional view of the arrangement of FIG. 7a. Here the gate area is realized by an underlying conductive layer 720 which may be made smaller and is not required to underlie electrodes 711, 712. One electrode 711 is arbitrarily deemed as source and the other electrode 712 serves as drain. Other geometric realizations are also possible and may be implemented as required or desired. FIG. 7c depicts symbols 740, 750, 760 that may be used to depict a carbon nanotube N-channel field effect transistor.

The carbon nanotube N-channel field effect transistor 700 is N-Channel due to the presence of absorbed oxygen from the atmosphere during fabrication. It is known that removing the oxygen and sealing to prevent its return results in a P-channel FET.

Figure 8A:
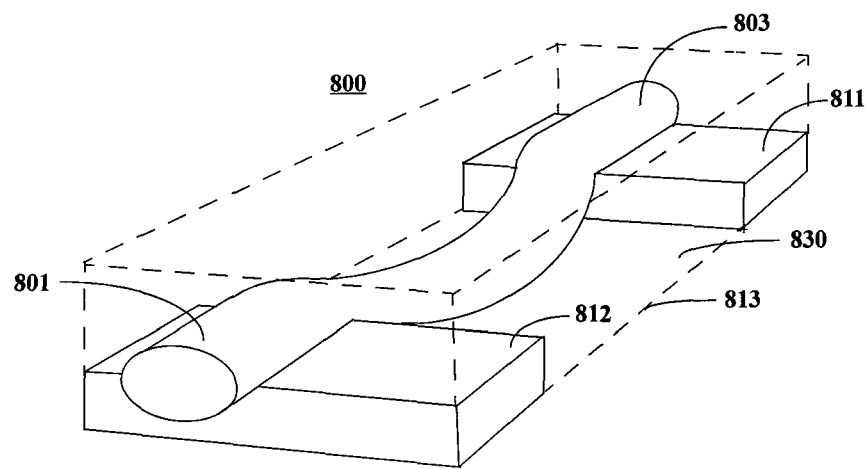
FIG. 8a depicts a carbon nanotube P-channel field effect transistor comprising a carbon nanotube draped between two electrodes over an underlying insulated gate area and sealed with an oxygen-impermeable layer.

FIG. 8a depicts a carbon nanotube P-channel field effect transistor 800 comprising a carbon nanotube 801 draped between two electrodes 811, 812 over an underlying insulated gate area 813 and sealed with an oxygen-impermeable layer 805. Current through the carbon nanotube 801 via its two electrodes 811, 812 is determined by the electric field between the underlying insulated gate area 813 and the local volume 803 of the nanotube 801.

Figure 8B:
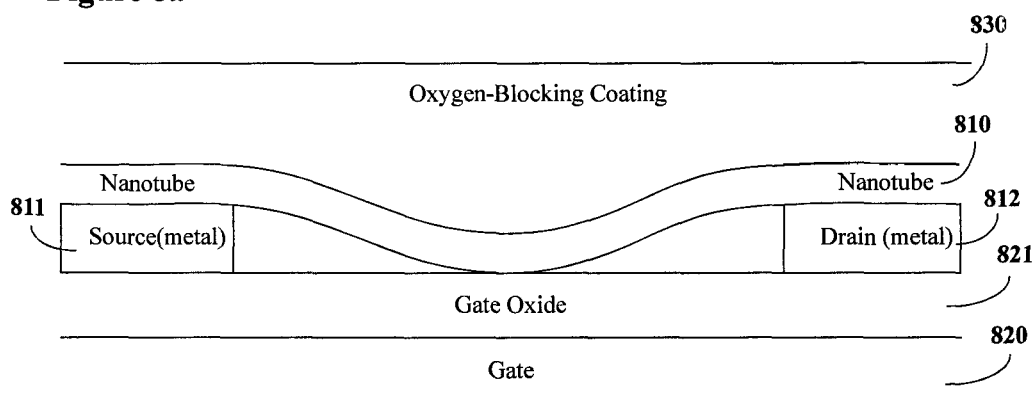
Figure 8C:
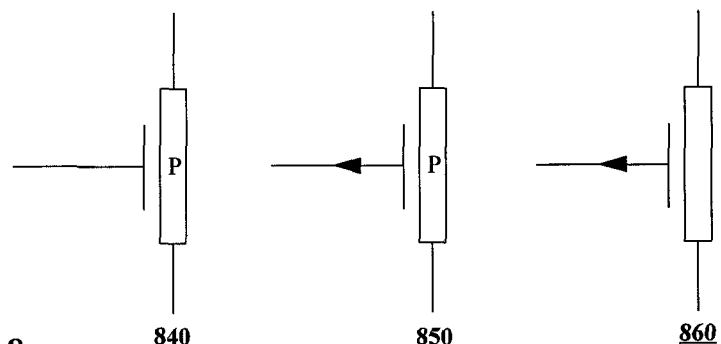
FIG. 8c depicts symbols that may be used to depict a carbon nanotube P-channel field effect transistor in circuit diagrams.

FIG. 8b illustrates a cross-sectional view of the arrangement of FIG. 8a. Here the gate area is realized by an underlying conductive layer 820 which may be made smaller and is not required to underlie electrodes 811, 812. Other geometric realizations are also possible and may be implemented as required or desired. FIG. 8c depicts symbols 840, 850, 860 that may be used to depict a carbon nanotube P-channel field effect transistor. An example of this is described in "Nanotube Electronics," Jan. 28, 2007, pg. 1-5, which is available at www.mtmi.vu.lt/pfk/funkc_dariniai/nanostructures/nano-tube.htm.

Figure 9A:
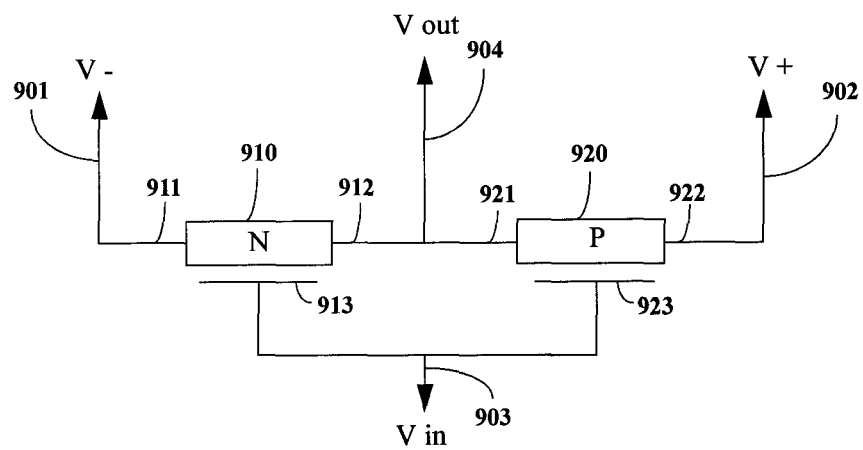
FIG. 9a shows a circuit diagram for a complementary field effect transistor logic inverter gate that has been implemented using the carbon nanotube field effect transistors of FIGS. 7a-7b and 8a-8b.

These two types of carbon nanotube field effect transistors have been shown to be useful in implementing a complementary field effect transistor logic inverter gate. An exemplary circuit diagram for this is shown in FIG. 9a. An example of this is described in the just-identified article of Nanotube Electronics.

Figure 9B:
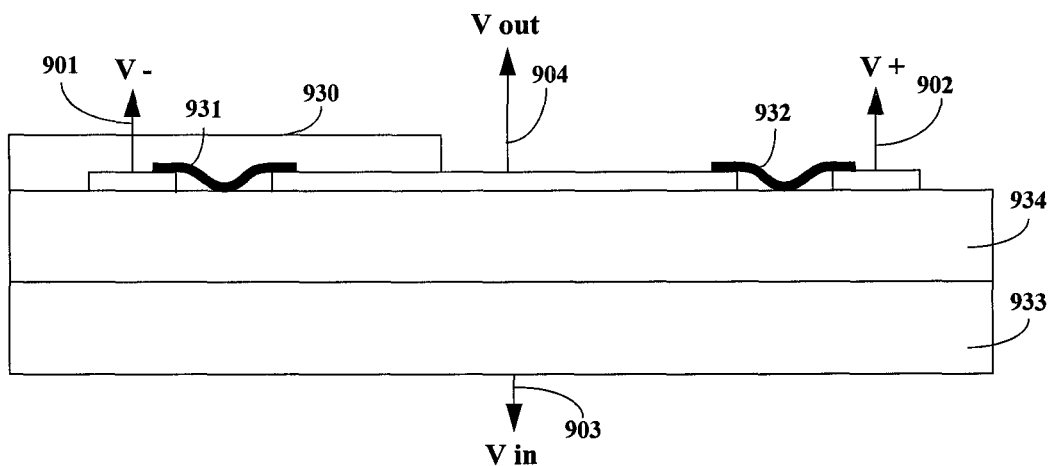
FIG. 9b is a cross-sectional view of a fabricated embodiment of this circuit utilizing two complementary carbon nanotube field effect transistors on a common substrate.
Figure 9C:
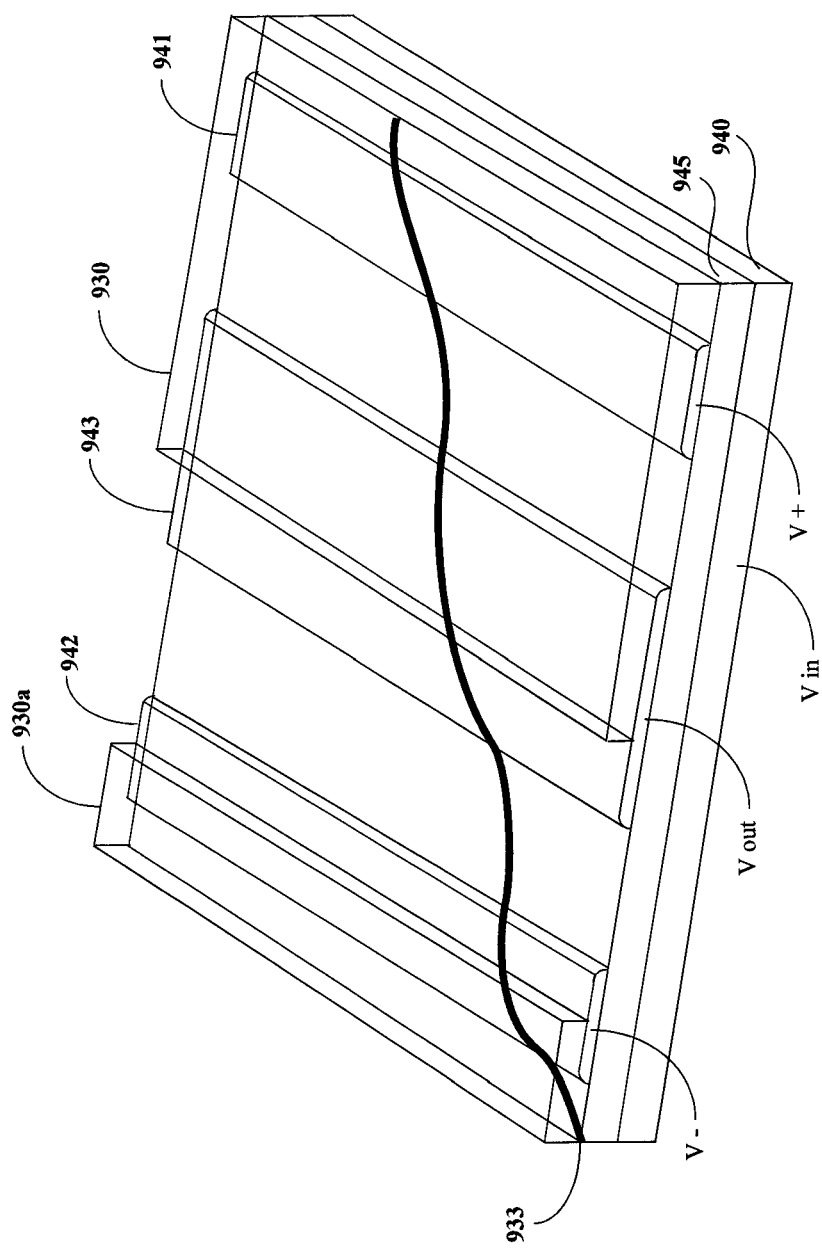
FIG. 9c depicts one technique for fabricating a circuit from a single nanotube by appropriate controlled positioning over electrodes and controlled deposition of oxygen-impermeable layer.

FIG. 9b shows a cross-sectional view of a fabricated embodiment of this circuit utilizing two complementary carbon nanotube field effect transistors on a common substrate. The P-channel FET typically requires an extra oxygen-impermeable layer. FIG. 9c shows one technique for fabricating the circuit from a single nanotube by appropriate controlled positioning over electrodes and controlled deposition of oxygen-impermeable layer. If desired, other known fabrication techniques, structures, and properties may be used including, for example, those which are described in a publication by Gojman, B., Hsin, H., Liang, J., Nezhdanova, N., and Saini, Jasmin, entitled "Y-Junction Carbon Nanotube Implementation of Intramolecular Electronic NAND Gate," Aug. 13, 2004, pg. 1-24.

Other types of CNFETs have been devised, proposed, studied and/or modeled. In some embodiments, the invention provides for the use of these other types of CNFETs rather than the ones described above in conjunction with FIGS. 7a-7b, 8a-8b, and 9b-9c. These other types of CNFETs include, among others:

single electron CNFET;
kinked-nanotube transistor;
carbon "Y" nanotube;
junction carbon nanotube transistor;
tunneling carbon nanotube transistor.

Examples of the forgoing elements are described in a publication by Richardson, W. H., entitled "Analysis of Carbon Nanotube Intramolecular p-n Tunnel Junction Transistors," Qusemde, 101 Industrial Road Unit 14, Belmont Calif. 94002, and a publication by Sachdev, C., published by Technology Research News and entitled "Nanotube Kinks Control Current," which is available at http://www.trnmag.com/Stories/2001/091201/Nanotube_kinks_control_current_091201.html, pg. 1-2.

Other related embodiments, following the spirit of the teachings herein, may be made utilizing one or more molecular transistors that do not comprise a carbon nanotube. Additionally, sensor interface circuits utilizing only the physical geometry and topology of the carbon "Y" nanotube (rather than special electrical properties) will be described in more detail below.

Attention is now directed to an implementation of nanoscale sensor interface electronic circuits, and in particular to realizations having carbon nanotubes. One basic circuit that can be used in the interfacing of a sensor or sensing-mode transducer is the differential amplifier. This circuit can be used to provide amplification and isolation for delicate signals produced. by carbon nanotube sensors and other nanoscale sensors. The differential input arrangement of the differential amplifier provides a basic structural and operational block that is very useful for creating feedback structures, particularly negative feedback, as well as in implementing comparators that can provide thresholding and analog-to-digital conversions operations. In one embodiment, a differential amplifier may be used as a comparator for use in converting analog-valued electrical signals to binary-valued electrical signals, other signals, event symbols, and the like.

Alternative embodiments provide for a plurality of comparators to convert analog-valued electrical signals to digitally-valued electrical signals, other signals, and event symbols, among others. If desired, a plurality of these comparators with adequately well-defined output voltage or current values may be used to convert digitally-valued electrical signals, other signals, event symbols, and the like, to analog-valued electrical signals. In some cases, digitally-valued electrical signals are provided, whatever there origin to be operated on by logic circuitry comprising carbon nanotube transistors.

Further, differential amplifiers can be ganged in cascades or further amplified in other ways to produce operational amplifiers. As is well known in the art, operational amplifiers can be used to implement a wide variety of sophisticated functions that are useful for interfacing with sensors and other circuits. Many of these useful sophisticated functions can be implemented in some form directly from a simple differential amplifier. These useful sophisticated functions realizable by simple differential amplifiers and/or from operational amplifiers comprised of differential amplifiers include, among others:
  analog unity-gain voltage-follower buffer;
  analog voltage gain amplifier;
  analog current gain amplifier;
  analog signal time-integrator;
  analog signal summer; analog signal inverter;
  analog signal filter;
  analog signal nonlinear amplifier;
  analog voltage-to-current converter; analog current-to-voltage converter;
  analog signal logarithmic amplifier;
  analog signal exponential amplifier;
  analog signal impedance gyrator;
  analog signal negative impedance converter;
  analog signal peak detector;
  analog signal precision rectifier;
  analog signal clamp;
  analog signal controller current source;
  analog signal transconductance amplifier;
  Schmitt trigger.
These are well-know to one skilled in the art of analog circuit design and are documented in many books. Examples of such devices are described in a publication by Jung W., entitled "IC Op-Amp Cookbook," published by Howard W. Sams & Co., Inc., Indianapolis, 1974 and the publication entitled "RCA Linear Integrated Circuits," RCA Corporation, Somerville, 1970. Additionally, in some situations one or both of the signal input transistors of a differential amplifier may be replaced with a sensor, thus integrating the sensor directly into the sensor interface circuit. In many situations this can save the number of electrical components required, reduce circuit and fabrication complexity, improve sensitivity, improve noise rejection, etc. Thus, in view of earlier discussions regarding the advantages of the configurations of FIGS. 1d through 1h, a carbon nanotube implementation of an analog differential amplifier is of considerable value for use in conjunction with carbon nanotube sensors.

Additionally, in one embodiment, a differential amplifier is used as part of a controllable analog signal transconductance amplifier, which in turn can be used to create a 2-quadrant or 4-quadrant analog multiplier. See, for example, the publication entitled "RCA Linear Integrated Circuits," RCA Corporation, Somerville, 1970.

Figure 10:
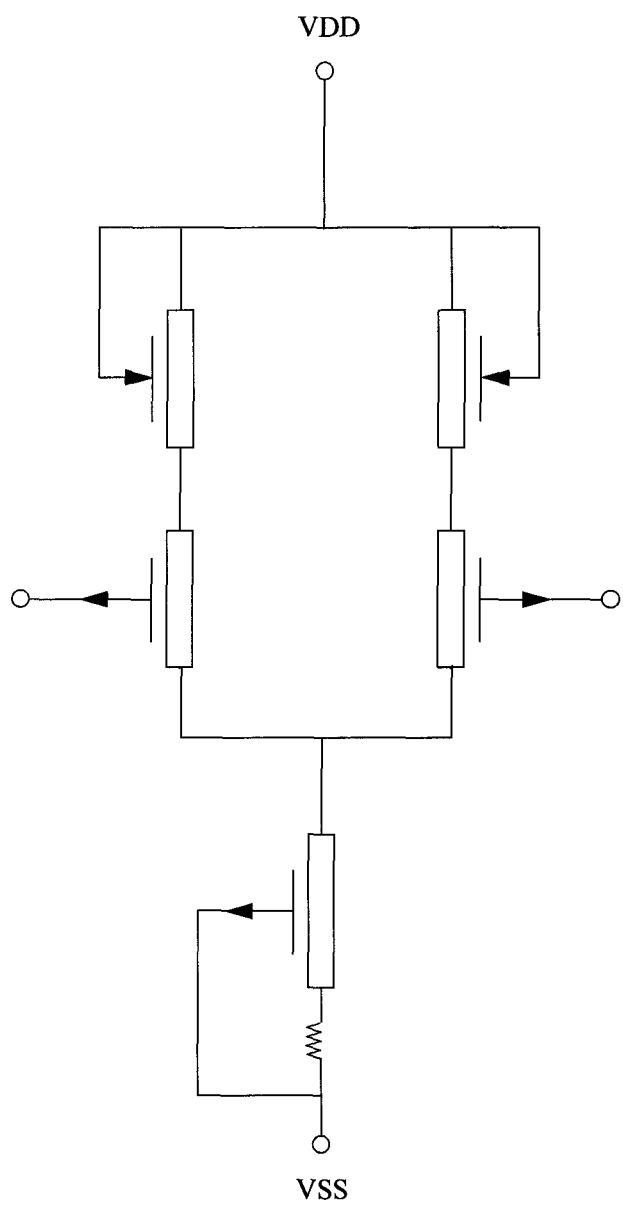
FIG. 10 shows an exemplary linear differential amplifier circuit realized with field-effect transistors, and employing active load transistors, that may be adapted for implementation with complementary carbon nanotube field-effect transistors.

FIG. 10 shows an exemplary linear differential amplifier circuit realized with field-effect transistors, and employing active (complementary) load transistors, that may be adapted for implementation with complementary carbon nanotube field-effect transistors. Such an arrangement is commonly implemented for traditional FET op amps and other types of integrated circuit components made from silicon. As will be seen, this arrangement will turn out to be especially attractive for realization by carbon nanotube field effect transistors for a number of reasons including, for example, the following:
  The use of mostly field effect transistors, in particular no use of load resistors;
  The only resistor in the circuit can be on the order of 1K-ohms;
  The interconnections among the transistors mostly involve connections between sources and drains;
  There are no topological loops in the circuit graph.

In general, a sensor input signal can be presented to either input. Power is shown being provided across the VDD and VSS terminals. If the lower three transistors are realized with N-channel field effect transistors, forcing the upper two (complementary active load) transistors to then comprise P-channel field effect transistors, VDD will serve as the positive voltage power terminal and VSS will serve as the negative voltage power terminal. If the types of transistors are reversed, VDD will serve as the negative voltage power terminal and VSS will serve as the positive voltage power terminal.

As is well known to one skilled in the art of analog circuits, signal output may be obtained at either or both of the juncture between each upper (complementary active load) transistor and its immediately connected neighbor signal input transistor. As is well known to one skilled in the art of analog circuits, these two signal outputs differ in sign as to the small-signal variation produced responsive to the signal inputs. For either output, an increase in voltage at one of the two signal inputs will cause an output signal voltage increase while an increase in voltage at the other signal inputs will cause an output signal voltage decrease as is well known to one skilled in the art of analog circuits.

Figure 11:
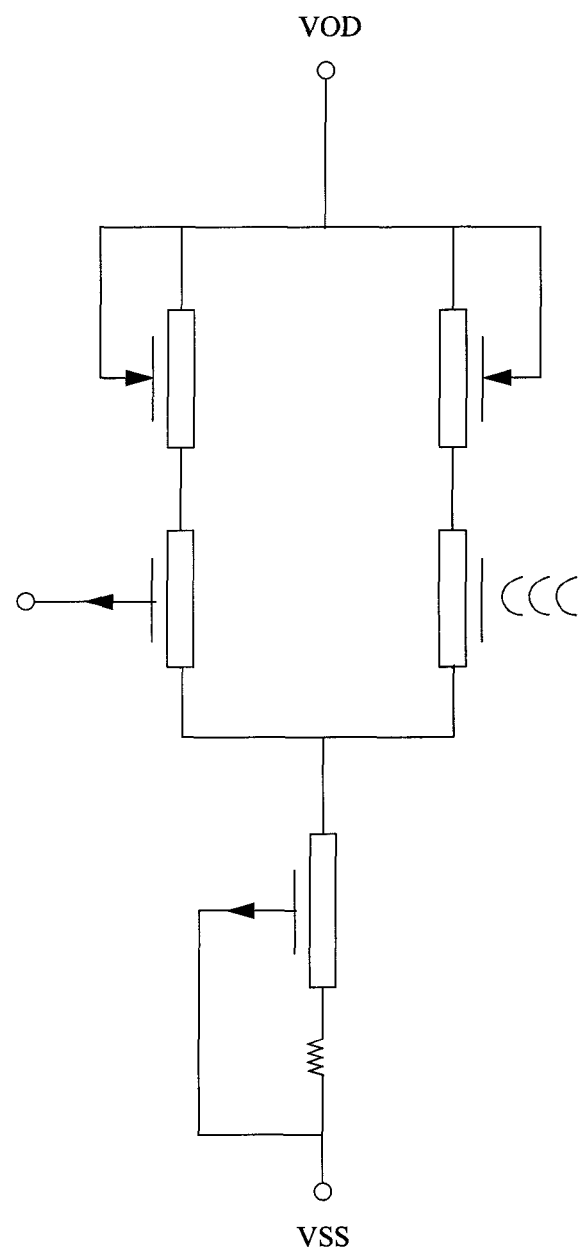
FIG. 11 shows the arrangement of FIG. 10 wherein one of the differential-input field effect transistors is replaced by a carbon nanotube sensor.

As discussed earlier, under certain conditions it is possible to replace one of the input transistors of a differential amplifier with a sensor element. FIG. 11 shows the arrangement of FIG. 10 wherein one of the differential-input field effect transistors is replaced by a carbon nanotube sensor. Alternatively, the signal input transistor on the left could be replaced with a sensor instead. Alternatively, both of the signal input transistors in FIG. 10 could be replaced with a sensor. The configuration of FIG. 11 and these variations will be called upon later in the discussion to follow.

Figure 12A:
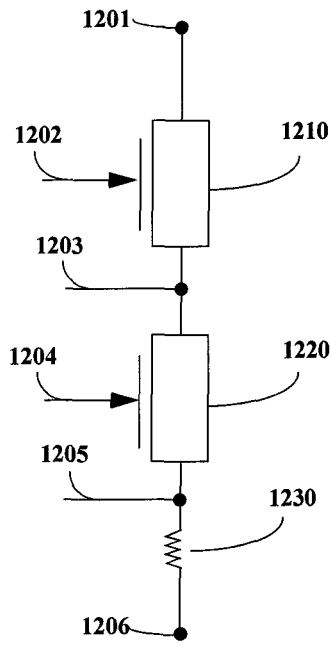
FIG. 12a shows one technique for adapting the field-effect current source of FIGS. 10 and 11 for electronic components and which can be realized with carbon nanotubes.

FIG. 12a depicts on example of how the field-effect current source of FIGS. 10 and 11 may be adapted for electronic components that can be realized with carbon nanotubes. In FIG. 9c, an example is provided from the digital carbon nanotube field effect transistor logic circuit art of a primitive two-CNFET logic gate wherein two CNFETs, in the primitive logic gate circuit, share a drain terminal realized by a single carbon nanotube. This embodiment provides for generalizations wherein far more general circuit topologies involving connected components can be realized with a common carbon nanotube draped across both shared and interconnected contacts. An example of this, wherein the current source for the differential amplifier circuits of FIGS. 10 and 11 is realized with a common carbon nanotube, is illustrated in FIGS. 12a and 12b.

In FIG. 12a, a single carbon nanotube 1200 lies across electrodes 1201-1206. If electrode 1204 lies below an insulating layer while adjacent electrodes 1203, 1205 connect directly to the carbon nanotube, a CNFET results. Similarly, if electrode 1202 lies below an insulating layer while adjacent electrodes 1201, 1203 connect directly to the carbon nanotube, a second CNFET results, and these two CNFETs share a terminal that could in many embodiments be either the source or drain of either FET. In this embodiment, insulated terminals 1202, 1204 may serve as the gates of these two interconnected CNFETs. The CNFETs may be either simultaneously or independently configured, via oxygen management, to be either N-channel or P-channel field effect transistors.

Figure 12B:
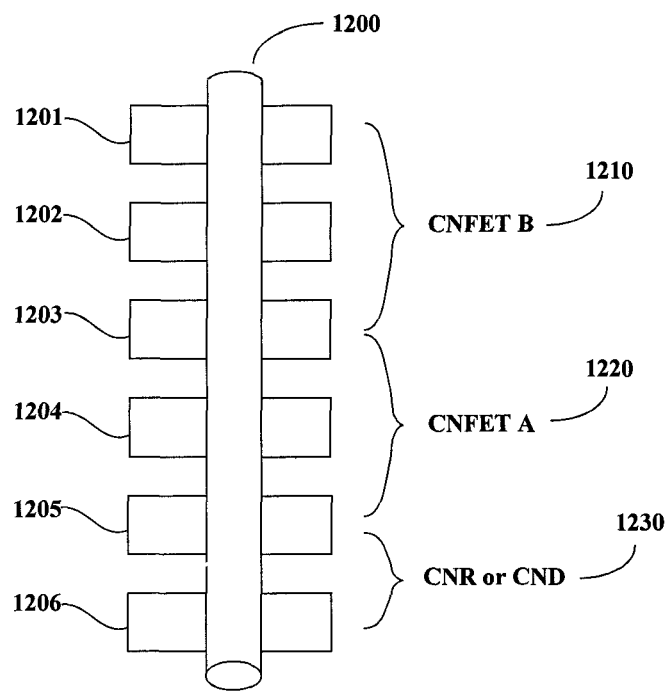
FIG. 12b shows a single carbon nanotube implementation of an exemplary cwent source that may be used for implementations of the field-effect current source of FIGS. 10 and 11.

Also shown in FIG. 12b is a sixth electrode 1206 under the nanotube. If this electrode 1206 is connected directly to the nanotube, the resulting structure between electrodes 1205 and 1205 can serve as a diode or resistor depending upon additional fabrication and electrical circuit operating points. Current approaches to carbon nanotube implementations of resistors thus far do not offer much range in resistance, typically offering a resistance on the order of 1K ohms. From the electrical bias and gain curves found in the art for the types of carbon nanotubes field effect transistors considered, experimental design and study confirms that an adequate current source for use with differential amplifiers can be realized with a resistive element 1230 with a resistive value of on the order of 1K ohms using the circuit of FIG. 12a. This arrangement, for example, permits making an analog differential amplifier from carbon nanotubes field effect transistors, and reducing the number of carbon nanotubes that must be involved and positioned.

Should other resistances be needed between terminals 1205 and 1206, or for other analog circuits, multiple carbon nanotube resistors may be interconnected in series, parallel, series-parallel, or yet other network arrangements to obtain multiples, sub-multiples, and other variations of the currently limited resistance value obtained by known carbon nanotube resistors. Alternative resistor techniques may also emerge which would provide a wider range of resistive values, and these arrangements may alternatively be implemented.

It is noted that, alternatively, the circuit element between electrodes 1205 and 1206 can be replaced with a junction or other form of diode realized by carbon nanotubes by simply employing other types of fabrication techniques. This would be useful in a current source implementation, albeit likely with a different circuit topology from that of FIG. 12a, if a stable voltage drop can be realized by the resulting carbon nanotube diode. Additionally it is noted that in other types of circuit implementations, sixth electrode 1206 may be insulated from the nanotube to form a capacitive or other type of circuit element between electrodes 1205 and 1206. Such a capacitive element may, for example, be put in parallel with resistive element 1230 to alter the higher frequency behavior of the circuit.

With the current source implementation above devised, one can now combine it with two interconnected complementary pairs of carbon nanotube transistors biased by the supply voltages and current source to operate in analog modalities rather than in saturating modes as is the case in digital CNFET logic circuits. Further, the carbon nanotube transistor whose channel type (P-channel or N-channel) is complementary to the type used in the current source can be wired so that its gate connects to its source terminal to form an active load transistor circuit. The result is a differential amplifier realized with carbon nanotubes.

Figure 13A:
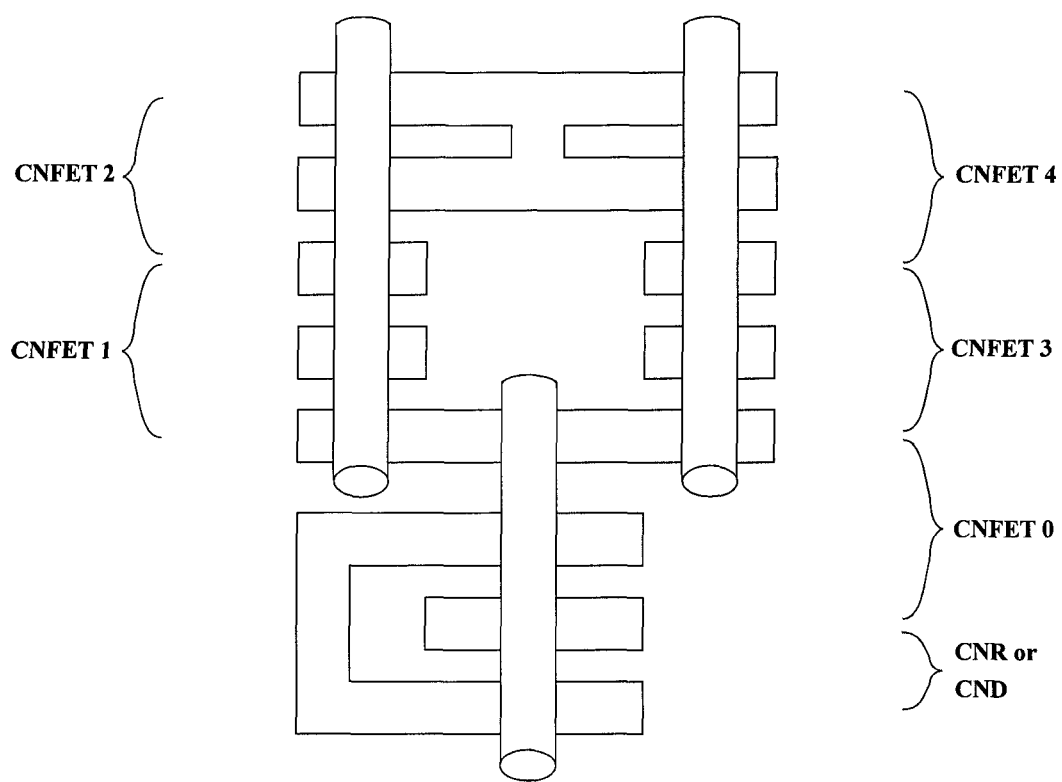
FIG. 13a shows a three carbon nanotube segment implementation of the differential amplifier circuit of FIG. 10. In this figure, CNFET1 or CNFET3 or both may be replaced with carbon nanotube sensors.

FIG. 13a shows a three carbon nanotube segment implementation of the exemplary implementation of the differential amplifier circuit of FIG. 10. In order to obtain a general structure illustration, however, shown here are only the relative positions of a segment of the three carbon nanotubes with respect to conductive electrical contacts and their interconnections. For clarity, the figure omits the oxide or other types of layers used to isolate electrical contacts from the carbon nanotubes to create the gate terminal of a CNFET. Also omitted are the oxide or other types of layers used to create P-channel CNFETs of FIGS. 8a-8b or other types of CNFETs. In this way, the same diagram can be used independent of the choice of the CNFET channel type (N-channel or P-channel) used for the current source and input CNFETs and the complementary CNFET channel type (P-channel or N-channel, respectively) used for the two active load CNFETs at the top of the diagram. The sequence of electrically conductive contacts and oxide or other insulating material layer segments thus define a sequence of interconnected CNFETs matching the circuit topology of FIG. 10. At the bottom of the diagram a carbon nanotube resistor is shown formed by two adjacent electrical contacts with no insulating gate terminal structure between them.

The conductive electrical contacts depicted in FIG. 13a may comprise metallization or conductive polymer layers, films, depositions, etc. The interconnections among the conductive electrical contacts may comprise the same electrically conductive material as the conductive electrical contacts or may be made of a different electrically conductive material. It is noted that non-metallic electrically conductive materials, used for contacts, interconnections, or both, can be selected according to heat conduction properties they may possess. For example, if the electrically conductive material is a poor conductor of heat, more heat can be concentrated in the carbon nanotube for heat sinlung designs. It is further noted that non-metallic electrically conductive materials, used for contacts, interconnections, or both, can be selected according to adherent properties they may possess in attaching and/or electrically contacting with the contacted region of the carbon nanotube. It is additionally noted that non-metallic electrically conductive materials, used for contacts, interconnections, or both, can be selected according to other electrical properties that they may possess.

Figure 13B:
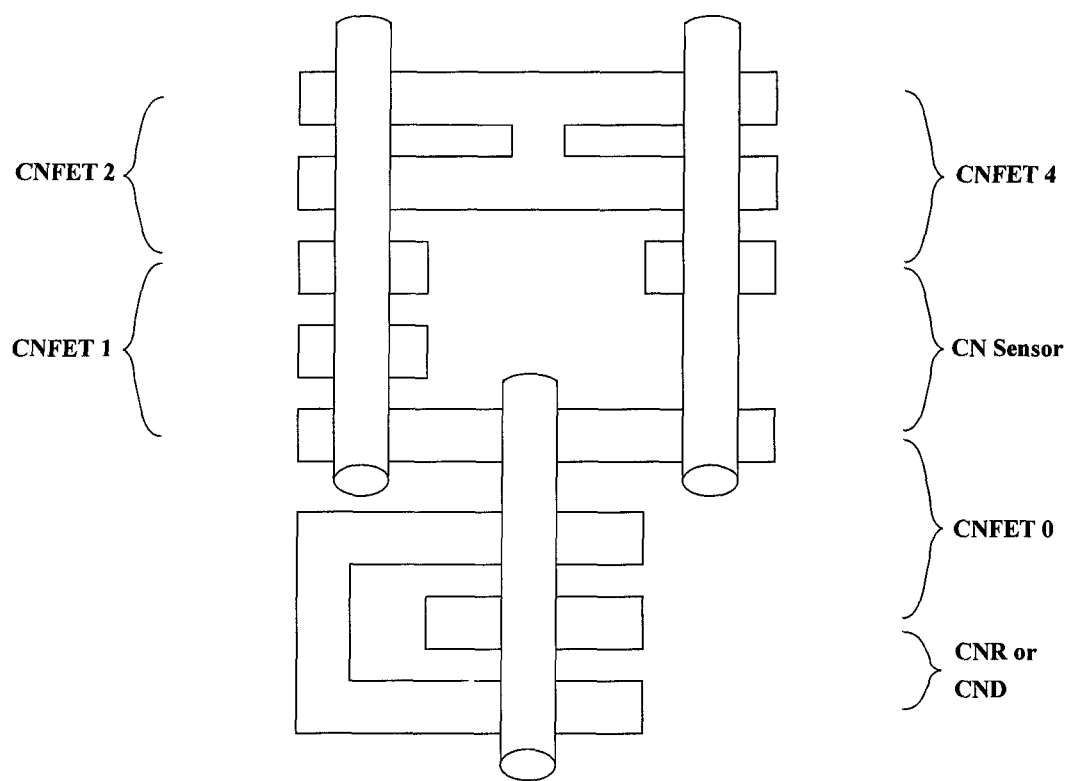
FIG. 13b shows the case where CNFET3 has been replaced with a carbon nanotube sensor.

Further, the arrangement of FIG. 13a can be modified so that either or both of the signal input transistors CNFET1 or CNFET3 are replaced with a carbon nanotube sensor. As an example, FIG. 13b shows an arrangement wherein CNFET3 has been replaced with a carbon nanotube sensor. If desired, CNFET1 may be replaced with a carbon nanotube sensor.

The arrangement of FIGS. 13a-13b includes the use of three carbon nanotubes with associated fabrication and alignment complexities. However, the circuit topology of the circuit of FIGS. 10 and 11 further allows the same carbon nanotube to be used for both the current source portion and continue on to be used for one of the two interconnected complementary pairs of carbon nanotube transistors. An example of this arrangement is depicted in FIG. 14a.

Figure 14A:
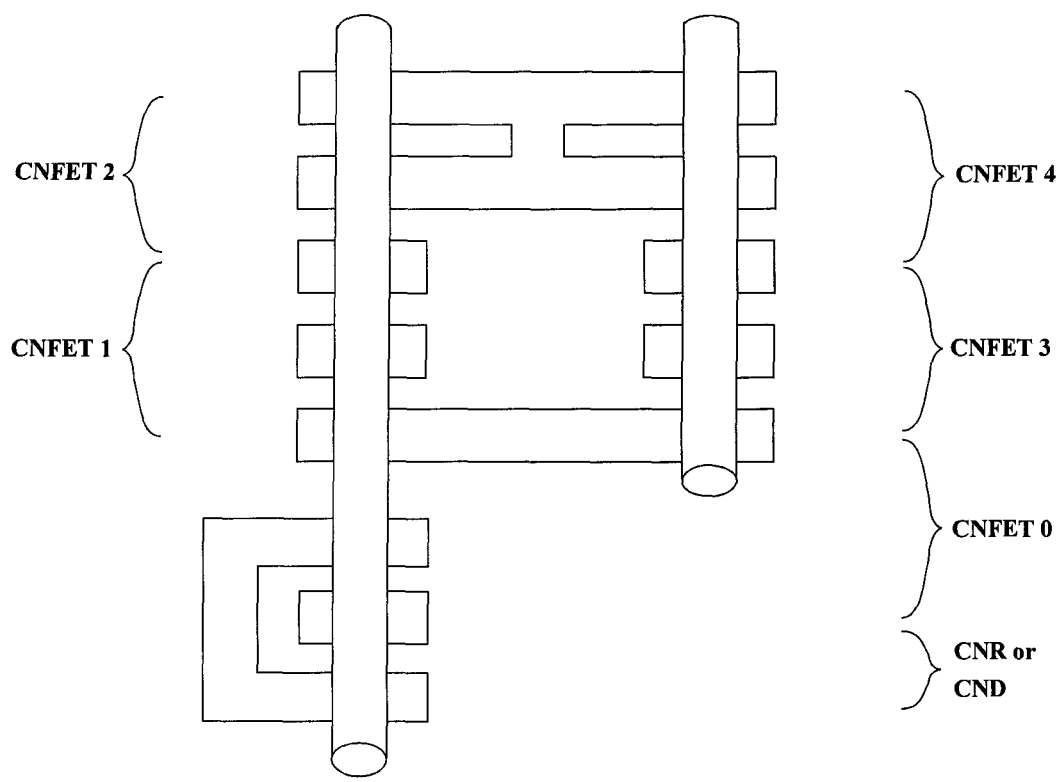
FIG. 14a shows a two carbon nanotube segment implementation of the exemplary two-stage linear differential amplifier circuit depicted in FIG. 10 made possible by sharing the same carbon nanotube between the current source and one of the differential input and active load stings of the differential amplifier.
Figure 14B:
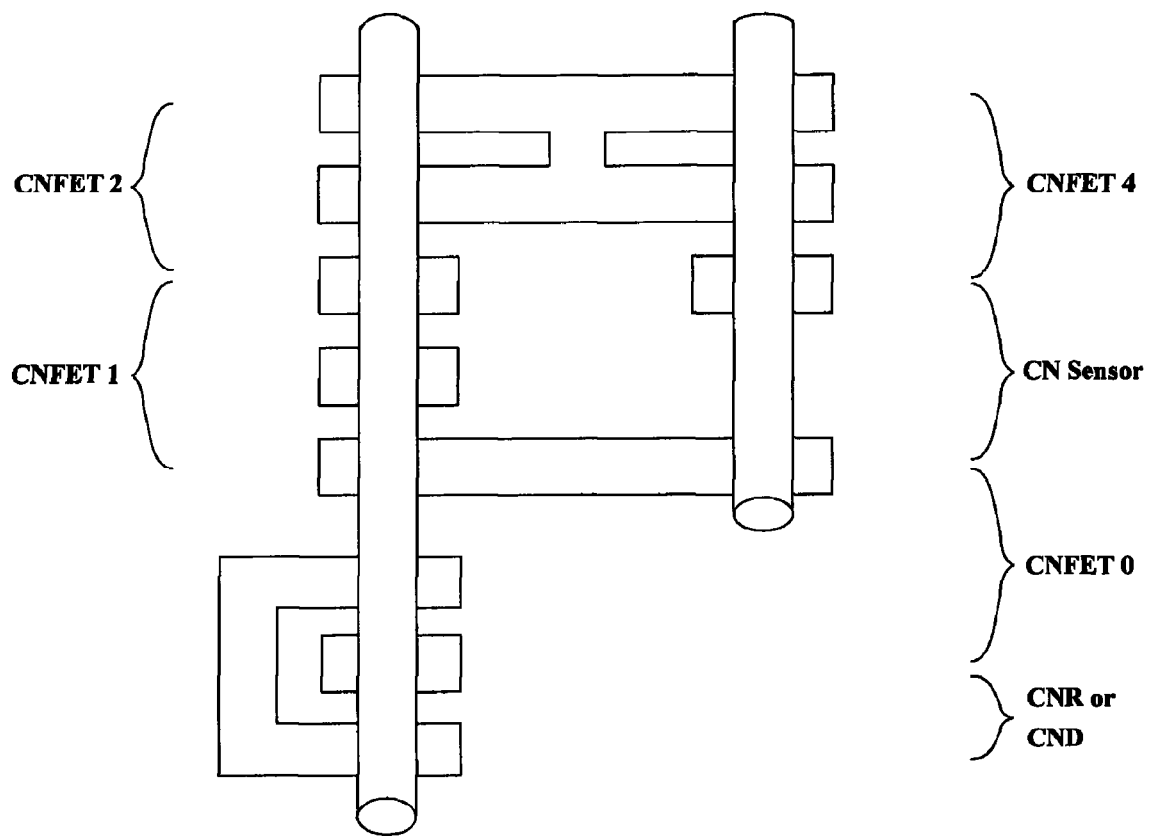
FIG. 14b shows a variation of FIG. 14a wherein CNFET3 has been replaced with a carbon nanotube sensor.
Figure 14C:
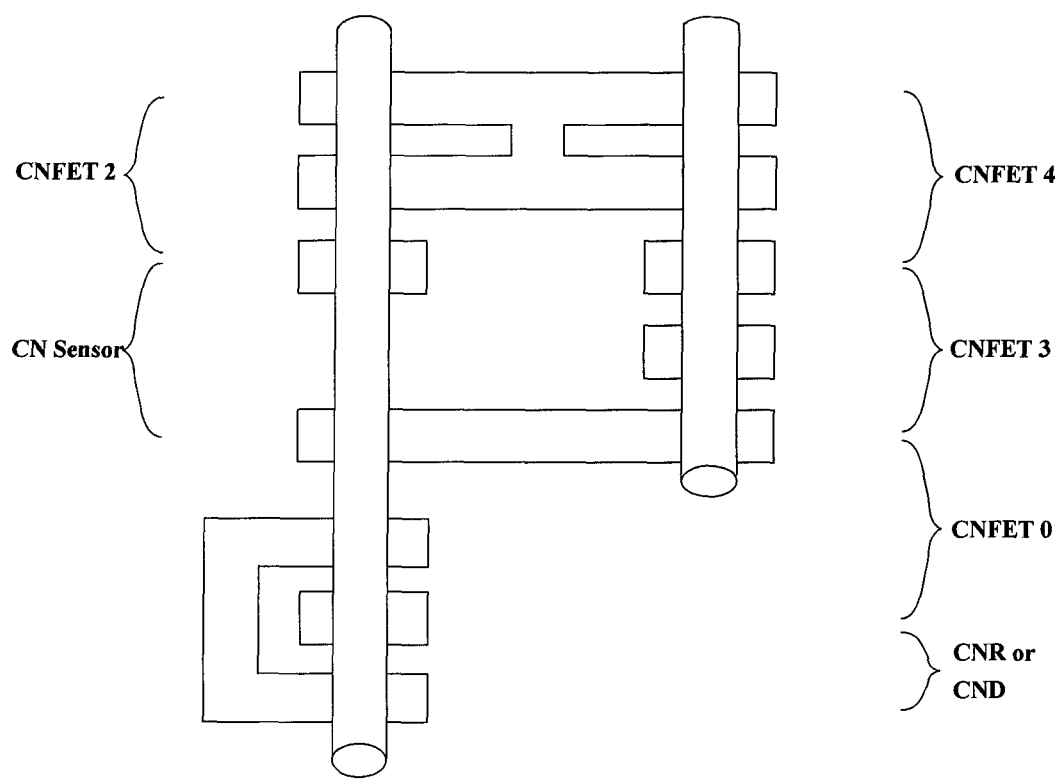
FIG. 14c shows a variation of FIG. 14a wherein CNFET1 has been replaced with a carbon nanotube sensor.

Specifically, FIG. 14a shows one of the two carbon nanotube segment implementation of the exemplary two-stage linear differential amplifier circuit depicted in FIG. 10 sharing the same carbon nanotube between the current source and one of the differential input and active load strings of the differential amplifier. In this arrangement, either or both of CNFET1 or CNFET3 may be replaced with carbon nanotube sensors. FIG. 14b shows the case where CNFET3 on the smaller carbon nanotube has been replaced with a carbon nanotube sensor. FIG. 14c shows the case where CNFETI on the longer carbon nanotube has been replaced with a carbon nanotube sensor.

It is noted that the ends of the carbon nanotubes or carbon nanotube segments depicted in FIGS. 12b through 14c are electrically active and cannot be seen as being able to freely permit a single carbon nanotube to serve as an arbitrary carbon nanotube segment. A single carbon nanotube can be shared to serve the roles of two carbon nanotube segments if the ends of these two segments share an electrical contact. As long as two pairs of carbon nanotube segments share a common electrical contact, however, a common same carbon nanotube can be shared, and this can be sequentially repeated to string together as many admissible pairwise sharings as there are available in the circuit. For the purposes of this disclosure, this will be referred to as a "carbon nanotube sharing principle." It will be used again in FIGS. 15a-15b, FIG. 19, and in later described extensions of FIG. 19.

Figure 15A:
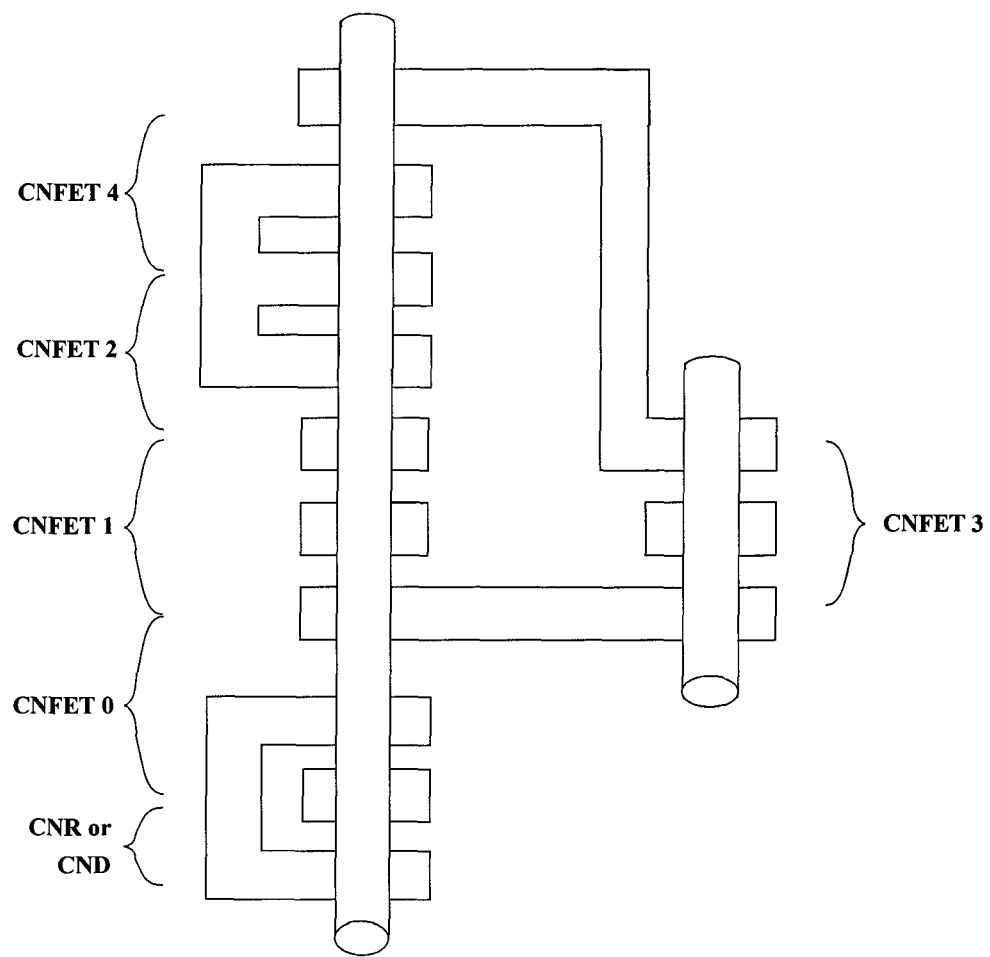
FIG. 15a shows a reorganization of the arrangement of FIG. 14a wherein the active load transistor CNFET4 is moved to the longer carbon nanotube to isolate CNFET3.

FIG. 15a shows a reorganization of the two carbon nanotube arrangement of FIG. 14a such that the active load transistor CIVET4 is moved to the longer carbon nanotube to isolate CNFET3. As CNFET3 provides significant amplification of the input voltage applied to it, such an arrangement is useful for improving noise rejection and parasitic electric effects by locating it near an associated carbon nanotube sensor.

Figure 15B:
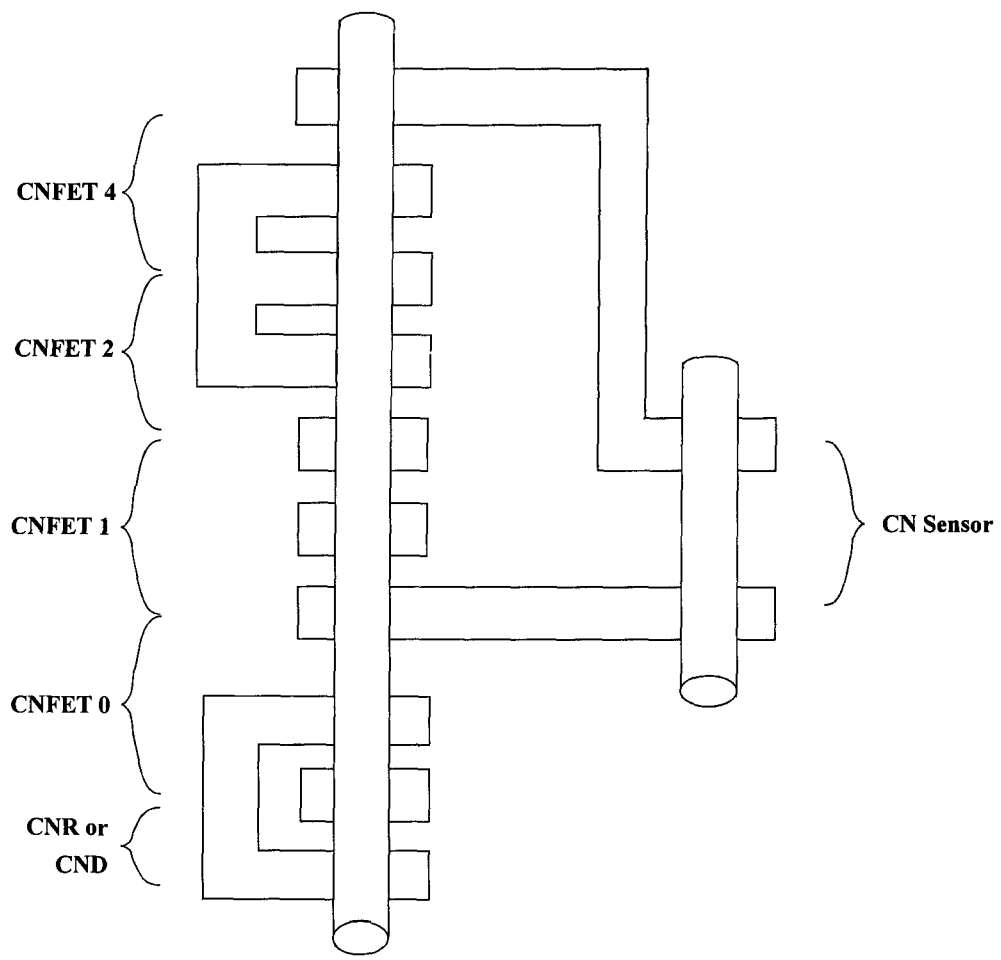
FIG. 15b shows a modification of FIG. 15a wherein isolated CNFET3 has been replaced by a carbon nanotube sensor.

FIG. 15*b* shows a further leverage of this geometric configuration. Specifically, FIG. 15*b* illustrates a modification of FIG. 15*a* wherein isolated CNFET3 has been replaced by a carbon nanotube sensor. This allows the carbon nanotube sensor to be located some distance from the rest of the electrical circuit comprised by FIG. 15*b*. Such an arrangement may be advantageous in cases where layout considerations, mechanical considerations, environmental conditions, or disturbances in the immediate vicinity of the carbon nanotube sensor would effect the sensor interface circuit, for example as would be expected in the sequenced electric-field droplet transport environments depicted in FIGS. 6*a* and 6*b*.

Figure 15C:
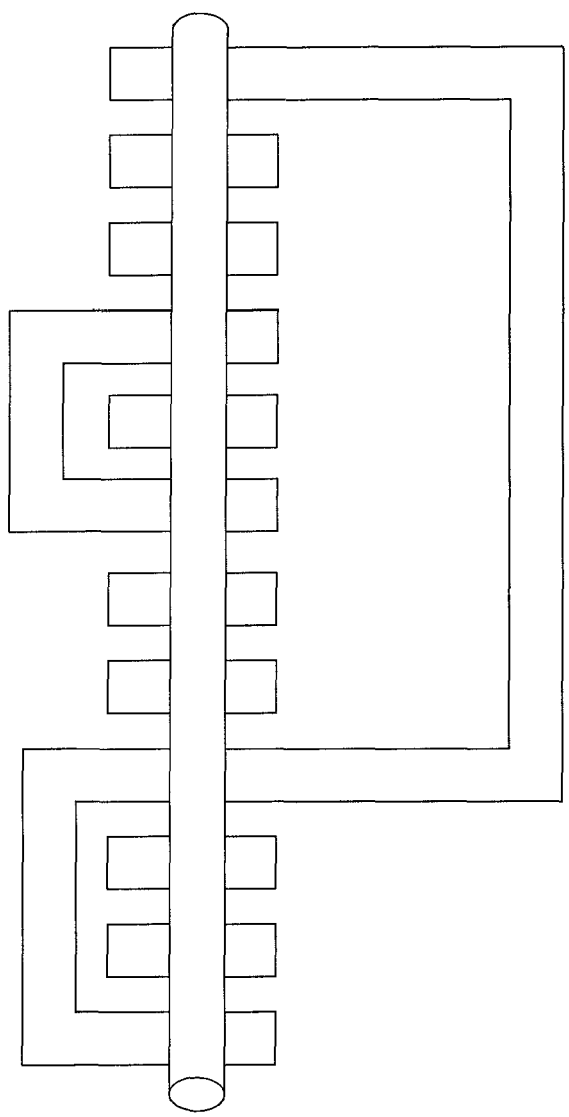
FIG. 15c depicts an example in which some or all of the differential amplifiers of FIGS. 10-11 may be implemented with a single carbon nanotube.

Further, by again employing the carbon nanotube sharing principle to FIG. 15*a*, it can be seen that some or all of the differential amplifiers of FIGS. 10-11 may be implemented with a single carbon nanotube. One example of this is shown in FIG. 15*c*.

The exemplary arrangements depicted in FIGS. 13*a* through 15*b* may also be modified so that a carbon nanotube transducer element is used as a load element, replacing at least one CNFET (for example CNFET2 and/or CNFET4). An alternative feature provides for the carbon nanotube transistors used in FIGS. 12*b* through 15*b* to be made of the same type of carbon nanotube material as at least one carbon nanotube transducer element. Such an arrangement can, in appropriately designed situations, allow a single carbon nanotube to simultaneously have one portion of its length serve as an input sensor embedded as an input element in a branch of a analog circuit, a transducer for a controller or actuator in the same or related branch of the same or related analog circuit, and as one or more CNFETs, resistors, capacitors, or diodes, in the same or related analog circuit. This is an example of an ultimate form of synergy opportunities shown in FIG. 1*h*.

Carbon nanotubes with a "Y" structure, which will be referred to as a "Y" carbon nanotube, can be fabricated as a two-input logic gate. An example of this is described by Knight, Will, in a publication entitled "Y-shaped Nanotubes are Ready-made Transistors," NewScientist.com, pg. 1-2, Jan. 29, 2007, which is available at http://www.newscientist-.com/article.ns?id=dn7847, and in a publication by Gojman, B., Hsin, H., Liang, J., Nezhdanova, N., and Saini, Jasmin, in a publication entitled "Y-Junction Carbon Nanotube Implementation of Intramolecular Electronic NAND Gate," Aug. 13, 2004, pg. 1-24.

Figure 16A:
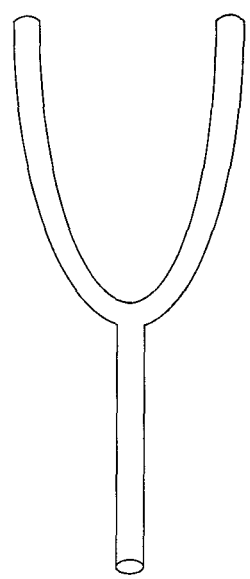
FIG. 16a depicts a "Y" carbon nanotube which can be fabricated as a two-input logic gate.
Figure 16B:
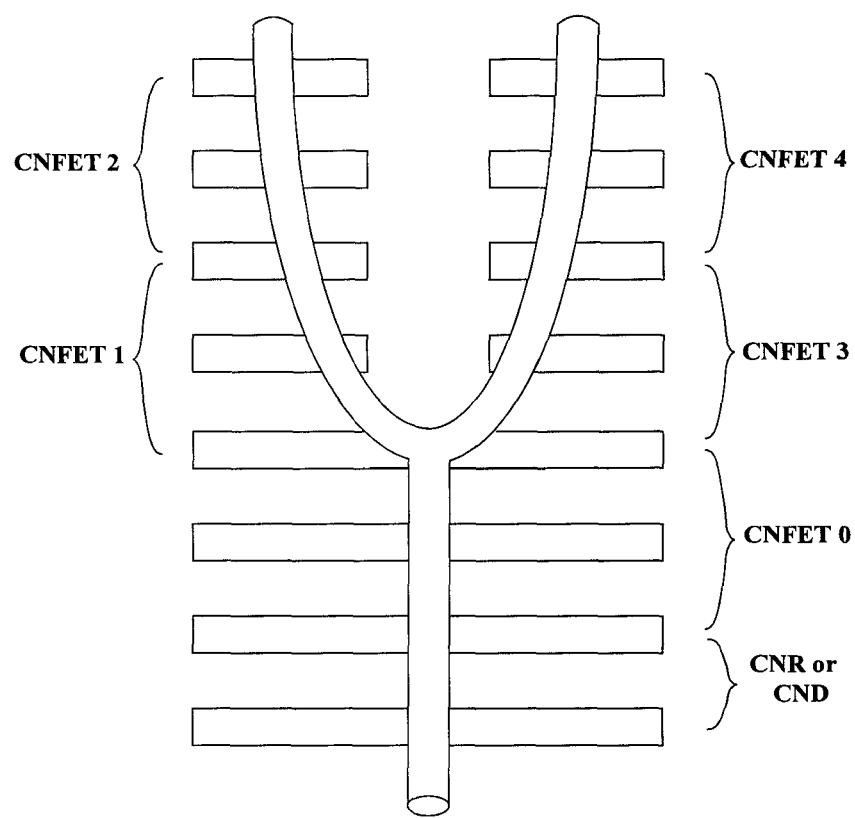
FIG. 16b depicts an example of electrodes located beneath the "Y" carbon nanotube to create environments for the carbon nanotube field effect transistors used in the circuits of FIGS. 10 and 11.

Although these can be used to produce alternate types of carbon nanotube transistors, it is possible to use the simple geometric and topological properties of a "Y" carbon nanotube, such as that depicted in FIG. 16*a*, to devise a single "Y" carbon nanotube implementation of the circuits of FIGS. 10 and 11. To begin, FIG. 16*b* shows one technique for locating electrodes beneath the "Y" carbon nanotube to create environments for the carbon nanotube field effect transistors used in the circuits of FIGS. 10 and 11. It is noted that either or both of CNFET1 or CNFET3 may be replaced with carbon nanotube sensors.

Figure 17:
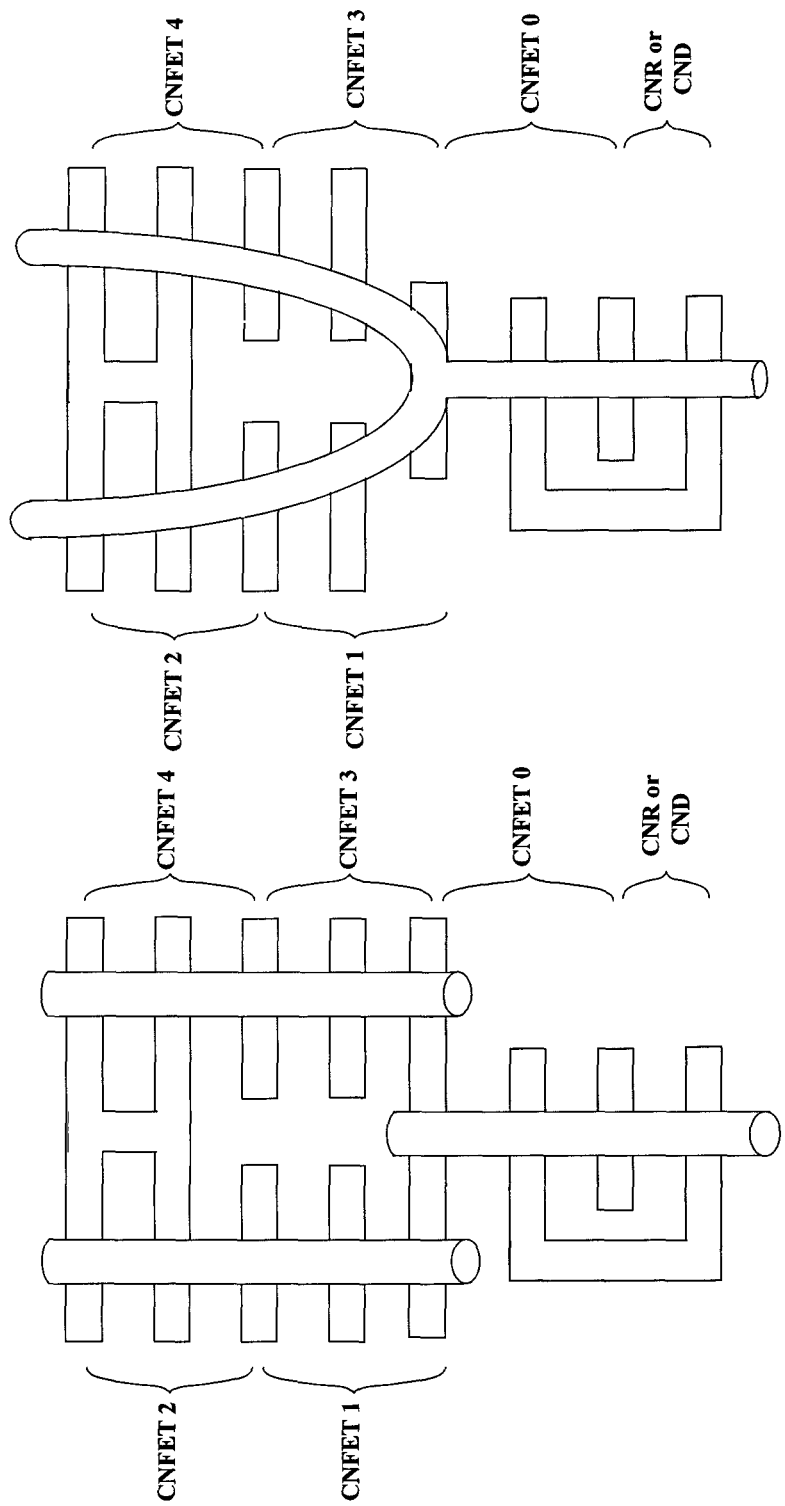
FIG. 17 shows interconnections of the contacts to realize the circuits of FIGS. 10 and 11, and a side-by-side comparison of this single "Y" nanotube realization with the three carbon nanotube implementation depicted in FIG. 13a. In this single "Y" nanotube realization, CNFET1 or CNFET3 or both may be replaced with carbon nanotube sensors.

FIG. 17 shows interconnections of the contacts to realize the circuits of FIGS. 10 and 11, for example, and shows this in side-by-side comparison with the three carbon nanotube implementation of FIG. 13*a*. In this single "Y" nanotube realization, CNFET1 or CNFET3 or both may be replaced with carbon nanotube sensors.

Figure 18:
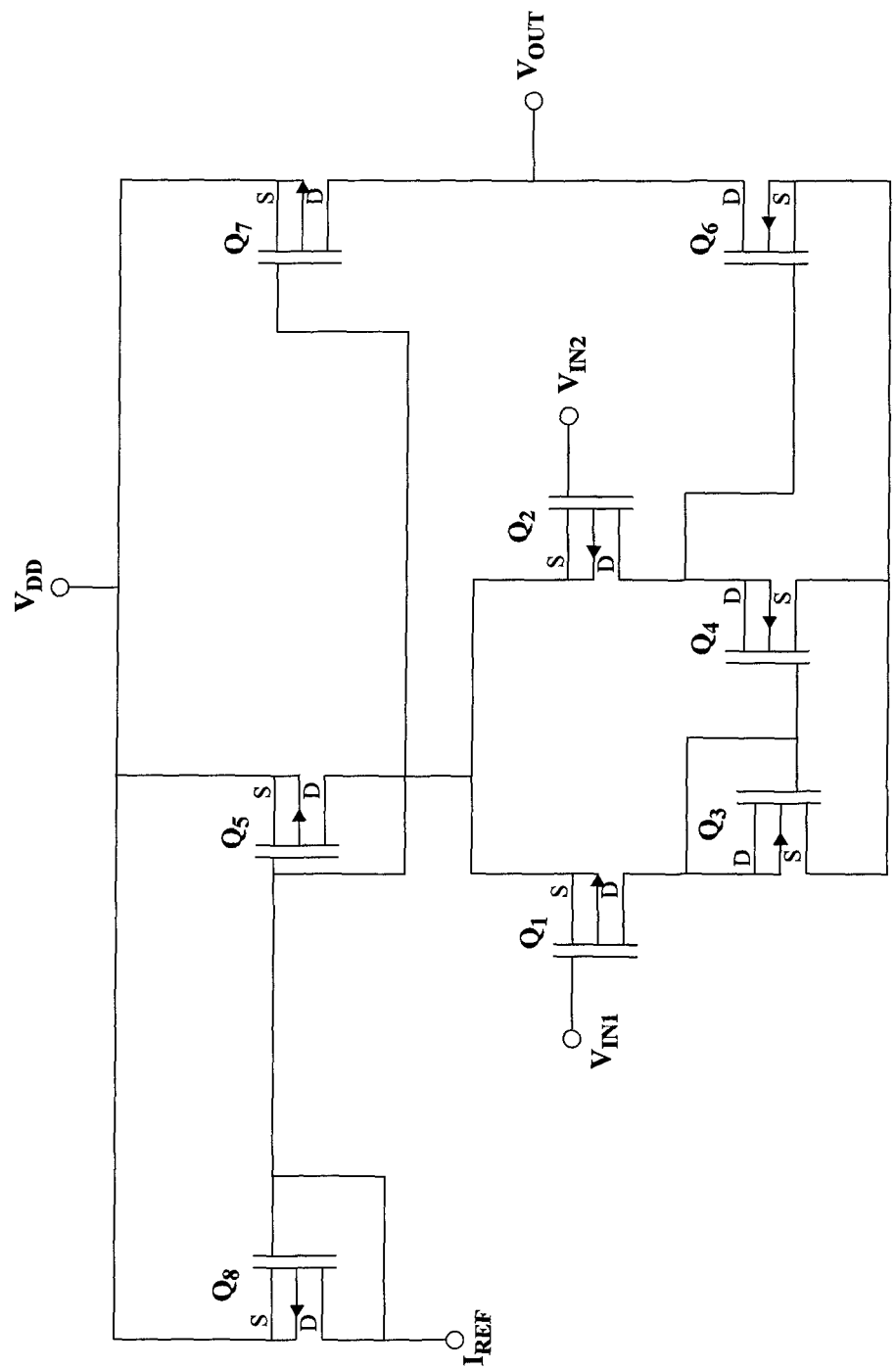
FIG. 18 shows an exemplary two-stage linear differential amplifier circuit realized with field-effect transistors, employing active load transistors, that may be adapted for implementation with complementary carbon nanotube field-effect transistors.

As indicated earlier, differential amplifiers can be ganged in cascades or further amplified in other ways to produce operational amplifiers which in turn can be used to implement a wide variety of sophisticated functions useful for interfacing with sensors and other circuits. FIG. 18 shows an exemplary two-stage linear differential amplifier circuit realized with field-effect transistors, and employing active load transistors, that may be adapted for implementation with complementary carbon nanotube field-effect transistors.

Figure 19:
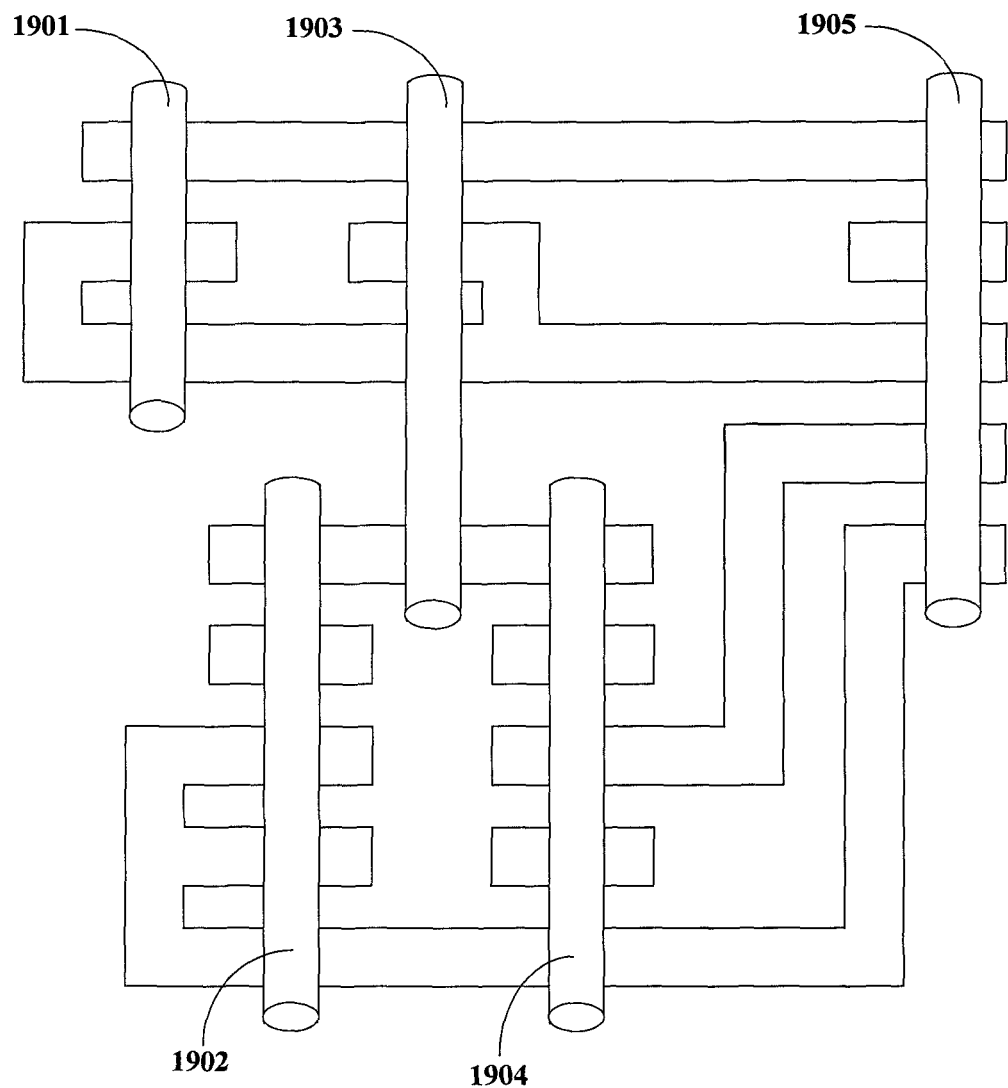
FIG. 19 illustrates one embodiment of a carbon nanotube realization of the circuit of FIG. 18.

Following the techniques developed so far in conjunction with the examples depicted in FIGS. 12*b* and 13*a*, a basic carbon nanotube implementation can be realized, for example as in the five carbon nanotube implementation depicted in FIG. 19. Other types of analog operational amplifier circuits and other analog electronic circuits may be implemented with carbon nanotubes in similar fashion. In one embodiment, long-tailed pair configurations may be used for stand alone differential amplifiers or as differential amplifier segments of operational amplifiers. In many situations, the carbon nanotube sharing principle developed and employed may be used quite advantageously to reduce the number of carbon nanotubes required.

Further, the carbon nanotube sharing principle techniques developed earlier and used in conjunction with FIGS. 14*a* and 15*a* can be used to reduce the total number of carbon nanotubes required. For example, numbering the five carbon nanotubes left to right as 1901-1905, the top end of carbon nanotube 1902 may continue on to serve as carbon nanotube 1903 and (if crossing over was not involved in an alternate layout) carbon nanotube 1904, by virtue of the shared electrical contact. Similarly the bottom of carbon nanotube 1902 can continue on to serve as carbon nanotube 1904 or carbon nanotube 1905 by virtue of the shared electrical contact connecting these. Accordingly, the bottom of carbon nanotube 1905 can continue on to serve as carbon nanotube 1902 or 1904, and the top of carbon nanotube 1905 can continue on to serve as carbon nanotube 1901 or 1903. Thus electrically equivalent implementations of FIG. 19 can be realized in a variety of ways requiring only two carbon nanotubes, for example:

carbon nanotube A serves as carbon nanotube segments 1901, 1903, 1902, 1904, while carbon nanotube B serves as carbon nanotube segment 1905;

Carbon nanotube A serves as carbon nanotube segments 1905, 1903, 1902, 1904, while carbon nanotube B serves as carbon nanotube segment b;

carbon nanotube A serves as carbon nanotube segments 1901, 1903, 1902, while carbon nanotube B serves as carbon nanotube segments 1904 and 1905.

In its presented for various simplified nanotube sharing forms, the carbon nanotube realization circuit of FIGS. 18 and 19 may be combined in various ways with the arrangements of FIGS. 13*a* through 15*b*. In one embodiment, the output signal from any of the arrangements of FIGS. 13*a* through 15 is amplified by the circuit of FIG. 19. In another embodiment, the circuit of FIGS. 18 and 19, or further expansions of these, is used as an operational amplifier for performing other functions on the output signal from the arrangement of any of the arrangements of FIGS. 13*a* through 15*b*. In other embodiments, combinations of two or more of the aforementioned arrangements are interconnected.

Further, selected signal input CNFETS in FIG. 19 may, in certain situations, be replaced with carbon nanotube sensors (or carbon nanotube transducers used as sensors). Additionally, selected active load CNFETS in FIG. 19 may, in certain situations, be replaced with control or actuation carbon nanotube transducers in the manner described earlier. As with the simpler differential amplifier, such an arrangement can, in appropriately designed situations, allow a single carbon nanotube to simultaneously have one portion of its length serve as an input sensor embedded as an input element in a branch of an analog circuit, a transducer for a controller or actuator in the same or related branch of the same or related analog circuit, and as one or more CNFETs, resistors, capacitors, or diodes, in the same or related analog circuit. This is an example of an ultimate form of the synergy opportunities referred to in FIG. 1h.

It is additionally noted that various "carbon nanotube sharing principles" disclosed herein have been implemented to select proven known circuits for advantageous reduction in the number of required carbon nanotubes needed to realizing the analog circuit. These principles can likewise also be applied to digital circuits. In addition, new types of circuits and nanoscale electrical/sensor/transducer/actuator systems can be devised which introduce additional 'designed-in' opportunities to use the carbon nanotube sharing principle.

While the invention has been described in detail with reference to disclosed embodiments, various modifications within the scope of the invention will be apparent to those of ordinary skill in this technological field. It is to be appreciated that features described with respect to one embodiment typically may be applied to other embodiments. Therefore, the invention properly is to be construed with reference to the claims.

I claim:

1. An apparatus, comprising:
   a carbon nanotube;
   an actuator circuit formed using the carbon nanotube;
   first and second transistors formed using the carbon nanotube and configured as a differential amplifier configured to operate the actuator circuit responsive to an input signal.

2. The apparatus of claim 1, wherein each of the first and second transistors includes a respective gate terminal that is electrically insulated from the carbon nanotube and is configured to exert an electric field on the carbon nanotube.

3. The apparatus of claim 1, wherein the first transistor forms a first input circuit responsive to an electrical input signal, and wherein the actuator circuit forms a second input circuit in a form of a sensor responsive to an incoming stimulus, and wherein the apparatus is configured to produce a differential output based on the electrical input signal and the incoming stimulus.

4. The apparatus of claim 3, wherein the incoming stimulus is an optical signal.

5. The apparatus of claim 3, wherein the incoming stimulus is a chemical reaction.

6. The apparatus of claim 3, wherein the incoming stimulus is a temperature.

7. The apparatus of claim 3, wherein the incoming stimulus is a gas pressure.

8. The apparatus of claim 3, wherein the incoming stimulus is a contact pressure.

9. The apparatus of claim 1, further comprising a third transistor coupled to the second transistor, wherein the third transistor is formed on the carbon nanotube, and wherein respective gate terminals of the second and third transistors are coupled to a power node.

10. The apparatus of claim 9, further comprising a current source, wherein the current source includes a fourth transistor formed on the carbon nanotube.

11. The apparatus of claim 10, wherein the first transistor and the actuator circuit are coupled to the fourth transistor.

12. The apparatus of claim 1, wherein the actuator circuit includes a mechanical displacement transducer.

13. The apparatus of claim 1, wherein the actuator circuit includes a nanoscale electromechanical relay.

14. The apparatus of claim 1, wherein the actuator circuit includes a fluidic valve transducer.

15. A differential amplifier, comprising:
    a first transistor implemented using a carbon nanotube; and
    a second transistor implemented using the carbon nanotube;
    wherein each of the first and second transistors includes a respective gate terminal electrically insulated from the carbon nanotube.

16. The differential amplifier of claim 15, wherein the first transistor is configured to receive a first portion of a differential input signal on its respective gate terminal, and wherein the second transistor is configured to receive a second portion of a differential input signal on its respective gate terminal.

17. The differential amplifier of claim 15, further comprising a third and fourth transistors implemented on the carbon nanotube, wherein each of the third and fourth transistors includes respective source and drain terminals in electrical contact with the carbon nanotube, and further include respective gate terminals electrically insulated from and configured to exert a respective electric field on the carbon nanotube.

18. The differential amplifier of claim 17, wherein the third and fourth transistors are arranged to provide an active load for the differential amplifier.

19. The differential amplifier of claim 17, wherein the third transistor is electrically coupled to the first transistor, and wherein the second transistor is electrically coupled to the fourth transistor.

20. The differential amplifier of claim 17, further comprising a current source including a fifth transistor implemented on the carbon nanotube, wherein the fifth transistor is electrically coupled to the first and second transistors.

21. The differential amplifier of claim 20, further comprising a resistor implemented on the carbon nanotube, wherein the resistor is coupled between the fifth transistor and a ground node.

22. An apparatus comprising:
    a carbon nanotube;
    first and second transistors implemented using the carbon nanotube, wherein each of the first and second transistors includes a respective gate terminal coupled to a power node;
    a third transistor implemented using the carbon nanotube and electrically coupled to the first transistor, wherein the third transistor is configured to receive an electrical input signal;
    an actuator implemented using the carbon nanotube, wherein the actuator is configured to respond to an incoming stimulus, wherein the actuator is electrically coupled to the second transistor; and
    a fourth transistor implemented using the carbon nanotube, wherein the fourth transistor is electrically coupled the third transistor and the actuator;
    wherein the apparatus is configured to generate a differential output signal based on the electrical input signal and the incoming stimulus.

23. The apparatus of claim 22, wherein the fourth transistor is configured to act as a current source.

24. The apparatus of claim 22, wherein the first and second transistors are configured to act as an active load.

25. The apparatus of claim 22, wherein the incoming stimulus is an optical signal.

26. The apparatus of claim 22, wherein the incoming stimulus is a temperature.

27. The apparatus of claim 22, wherein the incoming stimulus is a gas pressure.

28. The apparatus of claim 22, wherein the incoming stimulus is a contact pressure.

* * * * *